(12) United States Patent
Ohminami et al.

(10) Patent No.: US 7,515,258 B2
(45) Date of Patent: Apr. 7, 2009

(54) SEMICONDUCTOR DEVICE, AND METHOD AND APPARATUS FOR INSPECTING APPEARANCE THEREOF

(75) Inventors: Nobuyuki Ohminami, Fukuyama (JP); Takeshi Umemoto, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 301 days.

(21) Appl. No.: 11/604,676

(22) Filed: Nov. 28, 2006

(65) Prior Publication Data

US 2007/0132103 A1 Jun. 14, 2007

(30) Foreign Application Priority Data

Dec. 14, 2005 (JP) .............................. 2005-360611

(51) Int. Cl.
G01N 21/00 (2006.01)
(52) U.S. Cl. ................................. 356/237.2; 356/237.4
(58) Field of Classification Search ... 356/237.1–237.5, 356/445–446; 438/149; 257/758
See application file for complete search history.

(56) References Cited

U.S. PATENT DOCUMENTS

| | | | | |
|---|---|---|---|---|
| 5,278,012 A | * | 1/1994 | Yamanaka et al. | 430/30 |
| 5,517,027 A | * | 5/1996 | Nakagawa et al. | 250/306 |
| 5,715,052 A | * | 2/1998 | Fujino et al. | 356/237.2 |
| 5,798,831 A | * | 8/1998 | Hagiwara | 356/237.2 |
| 6,157,444 A | * | 12/2000 | Tomita et al. | 356/237.1 |
| 2008/0007725 A1 | * | 1/2008 | Togashi et al. | 356/237.2 |
| 2008/0015802 A1 | * | 1/2008 | Urano et al. | 702/81 |

FOREIGN PATENT DOCUMENTS

| | | |
|---|---|---|
| JP | 2004-294194 | 10/2004 |
| JP | 02008100133 A * | 5/2008 |

* cited by examiner

Primary Examiner—Hoa Q Pham
(74) Attorney, Agent, or Firm—Harness, Dickey & Pierce PLC

(57) ABSTRACT

A semiconductor device includes a first wiring layer having a first wiring, a second wiring layer having a second wiring formed over the first wiring layer, and a first insulating layer interposed between the first and second wiring layers, wherein the second wiring layer or an upper layer thereof has a fine projection, and the diameter of a circle circumscribing the projection in a plane or sectional view is 40 nm or less.

21 Claims, 20 Drawing Sheets

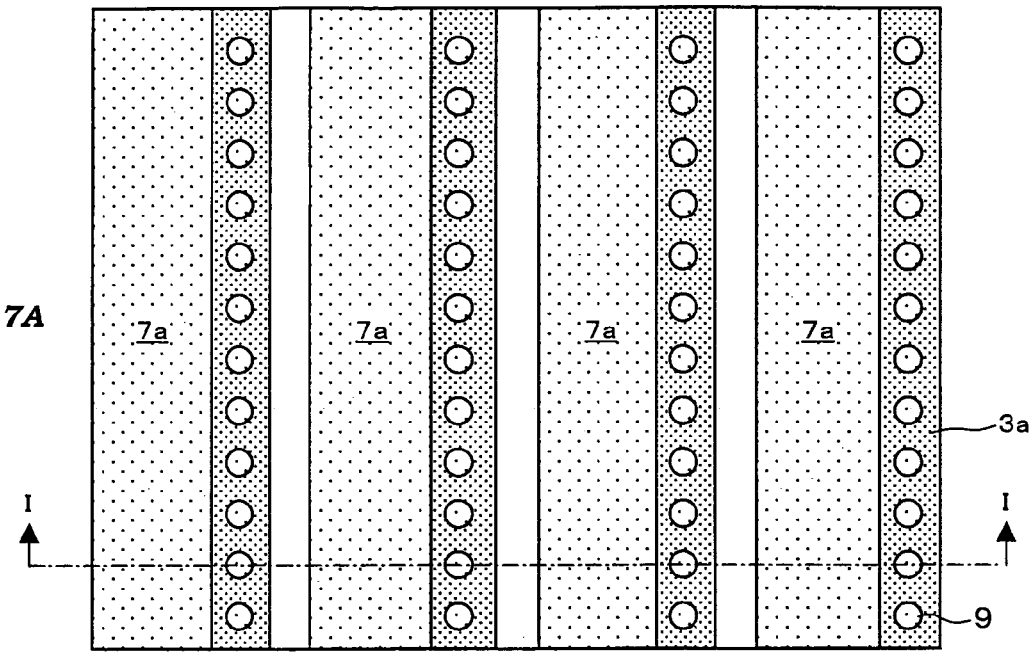
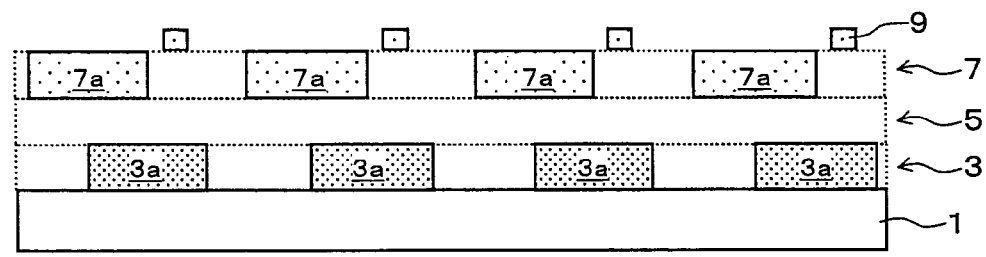
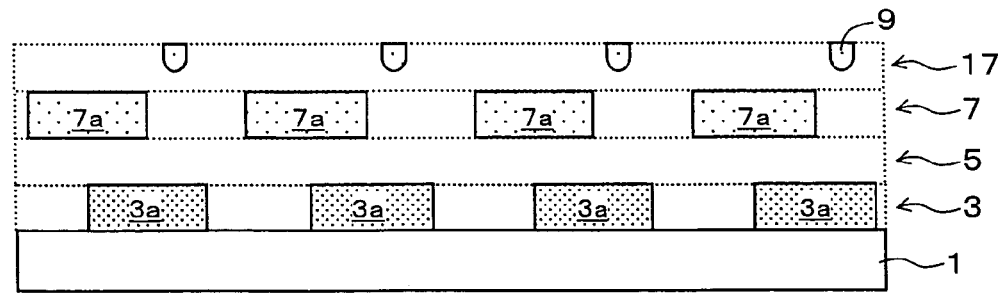
FIG. 7A
FIG. 7B
FIG. 7C

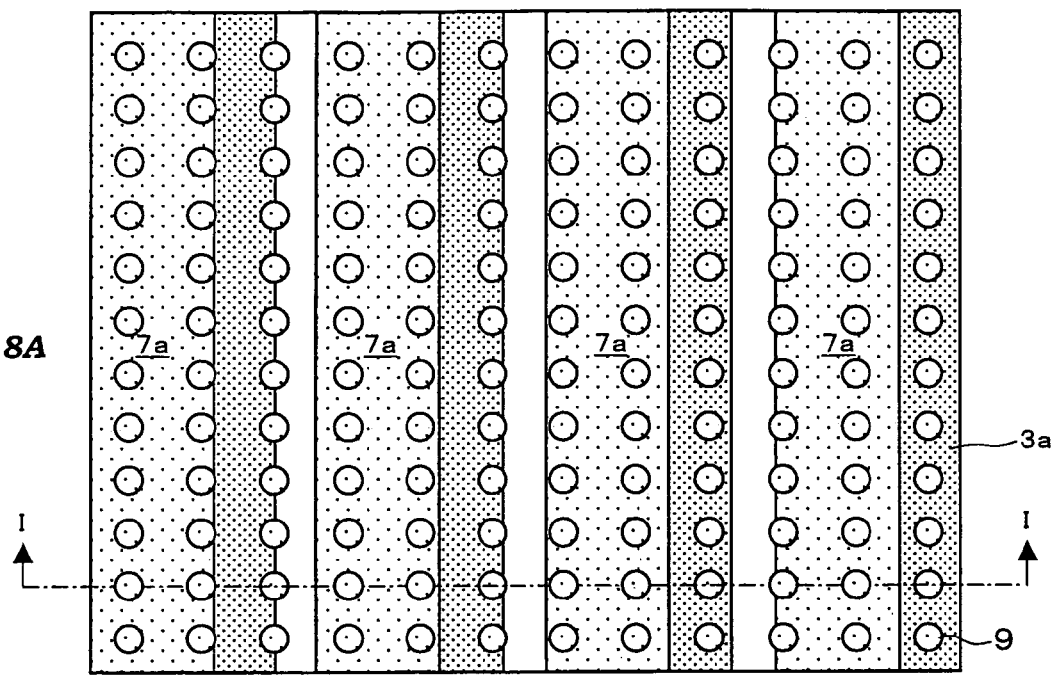
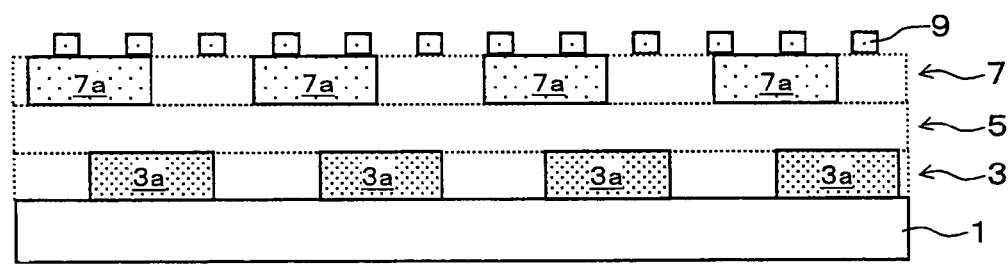

SEMICONDUCTOR DEVICE, AND METHOD AND APPARATUS FOR INSPECTING APPEARANCE THEREOF

CROSS-REFERENCE TO RELATED APPLICATION

This application is related to Japanese Patent Application No. 2005-360611 filed on Dec. 14, 2005, whose priory is claimed and the disclosure of which is incorporated by reference in its entirety.

BACKGROUND OF THE INVENTION

1. Field of the Invention

The present invention relates to a semiconductor device, a method for inspecting an appearance thereof, and an apparatus for inspecting an appearance thereof.

2. Description of Related Art

In general, semiconductor devices are each produced by laminating wiring layers, which each have a wiring pattern composed of plural wirings, and insulating layers on a semiconductor substrate. After the formation of each of the wiring layers, an appearance inspection of the wiring layer is usually made in order to inspect whether or not there is a defect, such as chipping-off of the wiring pattern or incorporation of an alien substance. This appearance inspection is performed, for example, by radiating light onto the surface of the wiring layer, receiving the light reflected on the wiring layer surface by means of an image pickup element, and then analyzing data obtained from the received light (see, for example, JP-A-2004-294194).

However, according to this method, the image pickup element may receive not only the reflected light from the wiring layer to be inspected but also reflected light from a underlying wiring layer disposed under the wiring layer to be inspected. In this case, the image pickup element detects a defect present in the underlying wiring layer, so that the precision of the appearance inspection lowers.

SUMMARY OF THE INVENTION

The present invention has been achieved in view of the aforementioned circumstances and provides a semiconductor device making it possible to restrain an influence of reflected light from an underlying wiring layer and make an appearance inspection with a higher precision.

Accordingly, the present invention provides a semiconductor device comprising a first wiring layer having a first wiring, a second wiring layer having a second wiring formed over the first wiring layer, and a first insulating layer interposed between the first and second wiring layers, wherein the second wiring layer or an upper layer thereof has a fine projection, and the diameter of a circle circumscribing the projection in a plane or sectional view is 40 nm or less.

As described above, this semiconductor device has a fine projection. When inspecting light composed of ultraviolet light is radiated to this semiconductor device in order to make an appearance inspection of the second wiring layer of this semiconductor device, the radiated inspecting light is subjected to Rayleigh scattering on the fine projection so that scattered light is generated. Moreover, the inspecting light partially passes through the second wiring layer and the first insulating layer to reach the first wiring layer, whereby the light is reflected on the first wiring layer. In some cases, this reflected light from the first wiring layer makes the precision of the inspection lower. In the present invention, the influence of the reflected light from the first wiring layer is restrained by the scattered light generated due to the existence of the fine projection. The detailed principle will be described below.

BRIEF DESCRIPTION OF THE DRAWINGS

FIG. 7A is a plane view illustrating the structure of a semiconductor device of an alternative embodiment of the invention, FIG. 7B is a sectional view taken on line I-I in FIG. 7A, and FIG. 7C is a sectional view illustrating the structure of a semiconductor device of a further alternative embodiment of the invention and corresponding to the FIG. 7B.

FIG. 8A is a plane view illustrating the structure of a semiconductor device of an alternative embodiment of the invention, and FIG. 8B is a sectional view taken on line I-I in FIG. 8A.

DESCRIPTION OF THE PREFERRED EMBODIMENTS

Figure 1A:
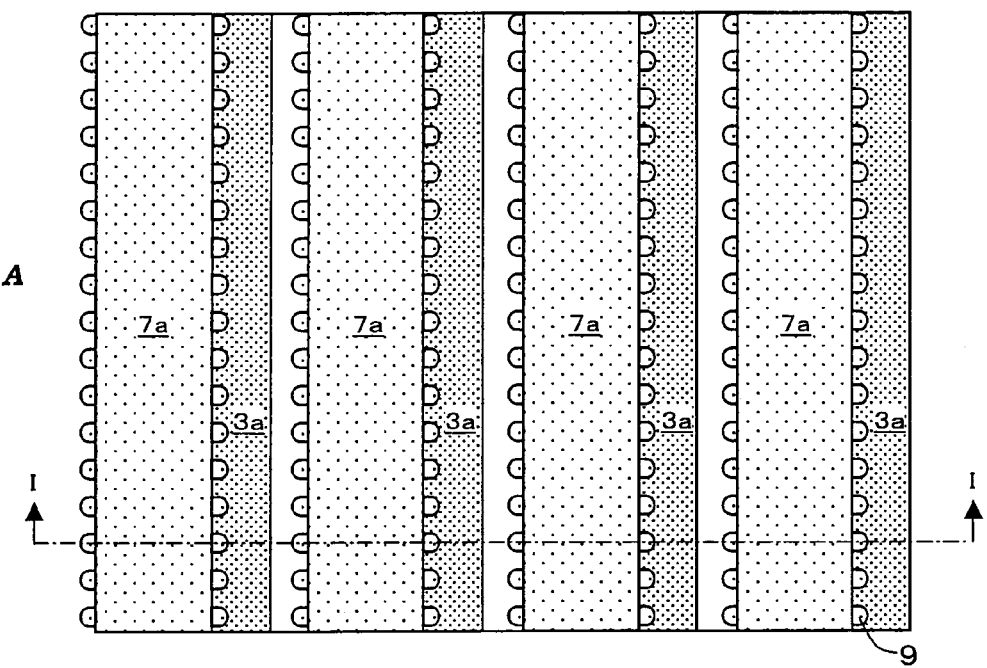
FIG. 1A is a plane view illustrating the structure of a semiconductor device of an embodiment of the invention.

A semiconductor device of the invention comprises a first wiring layer having a first wiring, a second wiring layer having a second wiring formed over the first wiring layer, and a first insulating layer interposed between the first and second wiring layers, wherein the second wiring layer or an upper layer thereof has a fine projection, and the diameter of a circle circumscribing the projection in a plane or sectional view is 40 nm or less.

As described above, the influence of the reflected light from the first wiring layer is restrained by the scattered light generated due to the existence of the fine projection.

Here, the principal where the influence of the reflected light from the first wiring layer is restrained, will be described.

The fine projection, which causes scattered light to be generated, is disposed in the second wiring layer, or the upper layer thereof; therefore, the intensity of the scattered light is relatively large. On the other hand, the reflected light from the first wiring layer is attenuated by reflection on the surface of the second wiring layer or absorption in the first insulating layer; therefore, the intensity thereof is relatively small. For this reason, by the influence of the above-mentioned scattered light, the reflected light from the first wiring layer is not recognized in regions close to regions where the scattered light is generated. This phenomenon is similar to a phenomenon that light from stars is not seen in the daytime. In this case, sunbeams are subjected to Rayleigh scattering by dusts in the air (or molecules in the atmosphere), so that scattered light is generated. Thus, light from stars, which has a relatively small intensity, comes not to be recognized by the influence of this scattered light.

For the above-mentioned principle, according to the invention, the influence of the reflected light from the underlying wiring layer is restrained so that an appearance inspection can be made with a higher precision.

The following describes a relationship between the size of the fine projection and Rayleigh scattering.

Rayleigh scattering is a phenomenon that light is scattered when a particle having a size which is sufficiently smaller than the wavelength of the light is present. The intensity $I(\theta)$ thereof is generally represented by the following expression (1):

$$I(\theta) = \{I_0 \times \pi^4 \times d^6/(8 \times R^2 \times \lambda^4)\} \times \{(m^2-1)/(m^2+1)\} \times (1+\cos^2\theta) \tag{1}$$

wherein $I_0$: intensity of incidence light, $\pi$: circular constant, d: particle size of a scattering particle, R: distance from the scattering particle, $\lambda$: wavelength of the light, m: refractive index, and $\theta$: angle to the incidence light.

This expression demonstrates that the intensity of scattered light is inversely proportional to the fourth power of the wavelength $\lambda$. Accordingly, the following can be understood: an appearance inspection using light containing a large amount of long wavelength components, such as white light, is slightly affected by Rayleigh scattering (that is, the ratio of the amount of Rayleigh scattering components to all amounts of the light is small); however, an appearance inspection using light of short wavelengths, such as ultraviolet light, is largely affected by Rayleigh scattering. The inventors have paid attention to the above-mentioned property of Rayleigh scattering, and found out that by willingly causing Rayleigh scattering in an appearance inspection using ultraviolet light, an influence of reflected light from an underlying wiring layer is restrained so that the appearance inspection can be made with a higher precision.

As a criterion as to whether or not Rayleigh scattering is effectively generated, the following expression (2) is suggested (see a document of "Physics of Light", written by Koichi Kobayashi, University of Tokyo Press):

$$d \leq \lambda \times \frac{1}{10} \tag{2}$$

The inspecting light used in the appearance inspection of the invention may be ultraviolet light (wavelengths: 4 to 400 nm preferably 100 to 400 nm, 200 to 400 nm, 300 to 400 nm, or 350 to 400 nm). In the case of using, for example, light having a wavelength of 400 nm as the inspecting light, the following result is obtained: $d \leq 40$ nm. Accordingly, it can be mentioned that when the particle size of a scattering particle is about 40 nm or less, Rayleigh scattering is effectively caused. In the case of using inspecting light having a shorter wavelength, the particle size of scattering particle for effectively causing Rayleigh scattering becomes smaller. However, the above-mentioned expression (2) is only an approximate criterion; therefore, it is not necessarily required that the expression (2) is strictly satisfied, and thus the inspecting light having a shorter wavelength can also be employed.

In the semiconductor device of the invention, the fine projection functions as a scattering particle. Accordingly, in the case that the diameter of a circle circumscribing the projection in a plane or sectional view is 40 nm or less, Rayleigh scattered light having a relatively large intensity can be caused.

Here, with reference to the attached drawings, embodiments of the present invention will be described hereinafter. The drawings are used for convenience of the description, and the scope of the invention is not limited to the embodiments described in the following descriptions or illustrated in the drawings.

1. Structure of Semiconductor Device

Figure 1B:
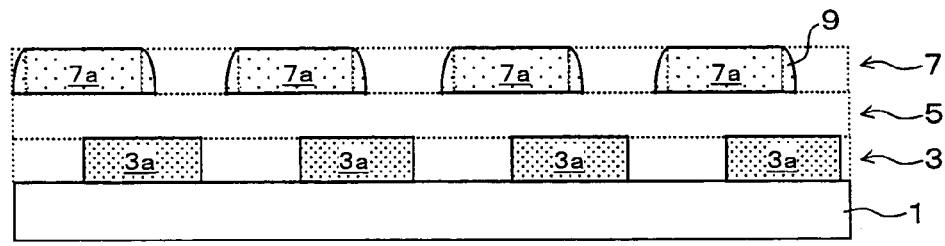
FIG. 1B is a sectional view taken on line I-I in FIG. 1A.

The structure of an embodiment of the semiconductor device of the invention is illustrated in FIGS. 1A and 1B. FIG. 1A is a plane view thereof, and FIG. 1B is a sectional view thereof taken on line I-I in FIG. 1A.

As illustrated in FIGS. 1A and 1B, the semiconductor device of the present embodiment has, on a semiconductor substrate 1, a first wiring layer 3 having plural first wirings 3a, a second wiring layer 7 formed over the first wiring layer 3 and having plural second wirings 7a, and a first insulating layer 5 interposed between the first and second wiring layers 3 and 7. The second wiring layer 7 has fine projections 9. The diameter of a circle circumscribing each of the projections 9 is 40 nm or less in a plane view like FIG. 1A or in a sectional view like FIG. 1B (hereinafter, the diameters of circles circumscribing the projection in a plane view and a sectional view are called "the plane diameter" and "the section diameter", respectively, and these are collectively called the "diameter"). Though plural fine projections 9 are usually employed, a single fine projection may be employed.

1-1. Description of Wiring Layer and Insulating Layer

Figure 2A:
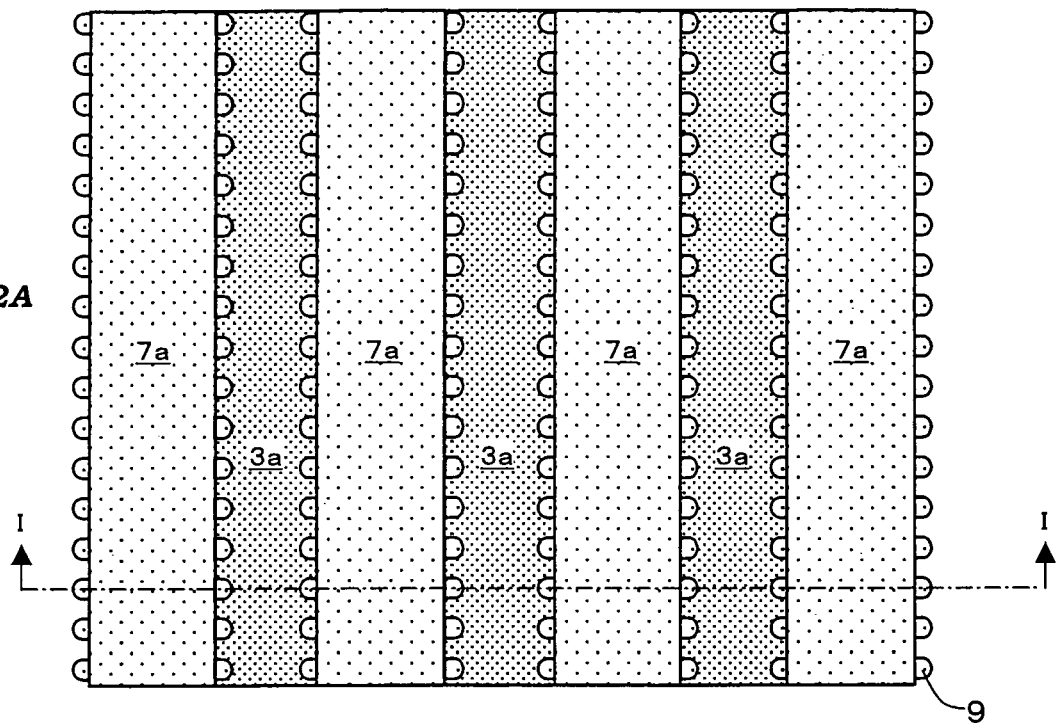
FIG. 2A is a plane view illustrating the structure of a semiconductor device of an alternative embodiment of the invention.
Figure 2B:
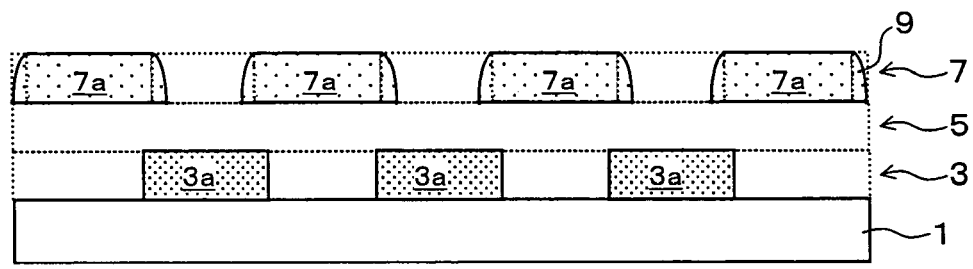
FIG. 2B is a sectional view taken on line I-I in FIG. 2A.

The first wirings 3a are disposed at regular intervals (i.e., periodically), and this is true of the second wirings 7a. The interval between adjacent two out of the first wirings 3a may be equal to or different from that between adjacent two out of the second wirings 7a. The respective first wirings 3a and the respective second wirings 7a are substantially parallel in a plane view. The second wirings 7a cover substantially a half of the first wirings 3a in a plane view. When the second wirings 7a cover the first wirings 3a to such an extent, an influence of reflected light from the first wirings 3a can be restrained by Rayleigh scattered light caused by the fine projections 9, as will be described later in Examples. As illustrated in FIGS. 2A and 2B, in an alternative embodiment, each of first wirings 3a is disposed below the center of adjacent two out of second wirings 7a. In this case, an influence of reflected light from the first wiring 3a is restrained by Rayleigh scattered light caused by fine projections 9 disposed on side faces of the above two second wirings 7a interposing the first wiring 3a. Thus, the restraint can be more effective.

Figure 3A:
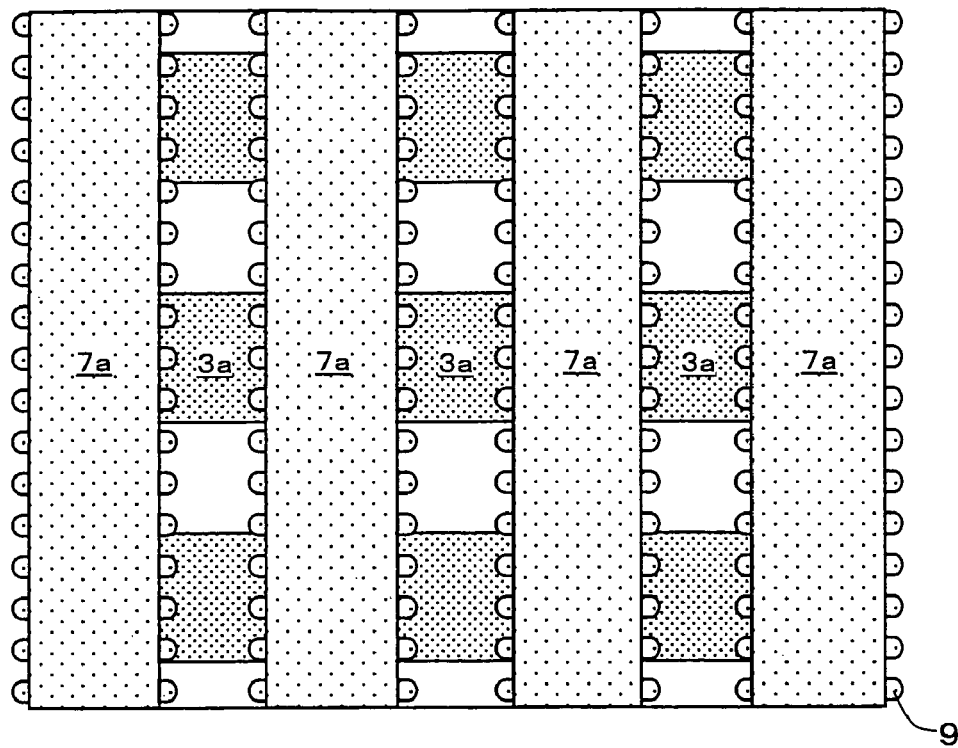
FIGS. 3A and 3B are each a plane view illustrating the structure of a semiconductor device of an alternative embodiment of the invention.
Figure 3B:
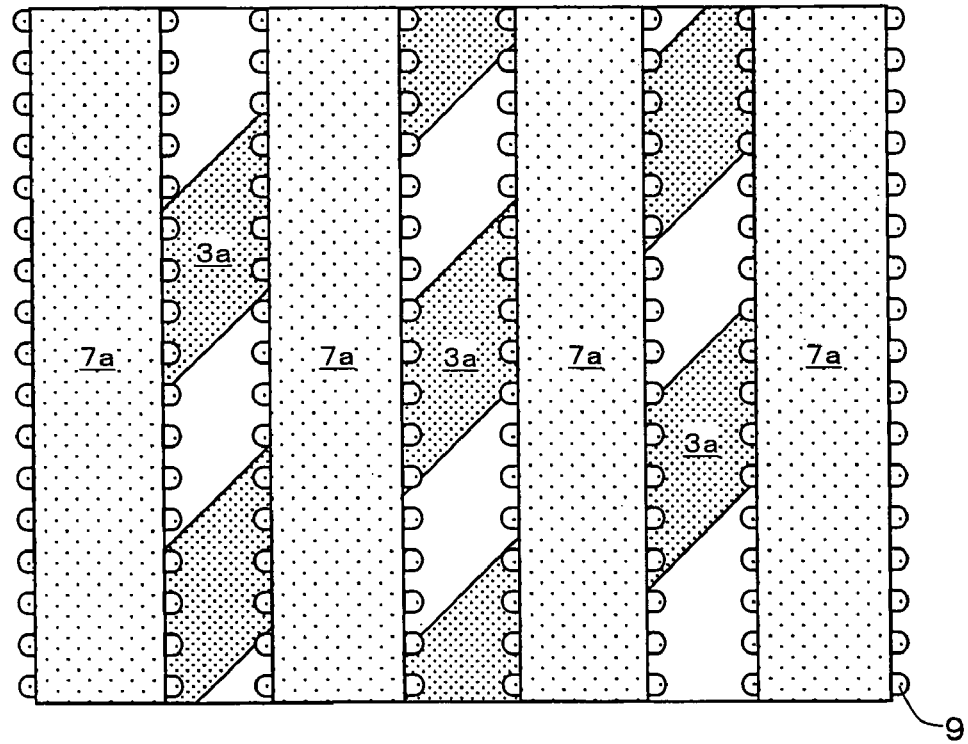

As illustrated in FIG. 3A, in a still alternative embodiment, respective first wirings 3a and respective second wirings 7a may cross at a substantially right angle in a plane view. Alternatively, as illustrated in FIG. 3B, they may cross obliquely in a plane view. In such dispositions also, an influence of reflected light from the first wirings 3a can be restrained by Rayleigh scattered light caused by fine projections 9. The number of the wirings in the first wiring layer 3 and that of the wirings in the second wiring layer 7 may be each plural, and either the first wiring layer 3 or the second wiring layer 7 may have only one wiring. Portions of the first wiring layer 3 other than the wirings 3a are filled with an insulating material such as silicon oxide, and this is true of the second wiring layer 7.

The first wirings 3a and the second wirings 7a may be made of an electroconductive material, or an insulating material. An example of the electroconductive material is Al—Cu alloy. An example of the insulating material is SiN. In the present specification, the word "wiring(s)" mean elongated or line-shaped member(s) which may be electroconductive or electric nonconductive. The material of the first wirings 3a may be the same as, or different from that of the second wirings 7a.

Figure 4:
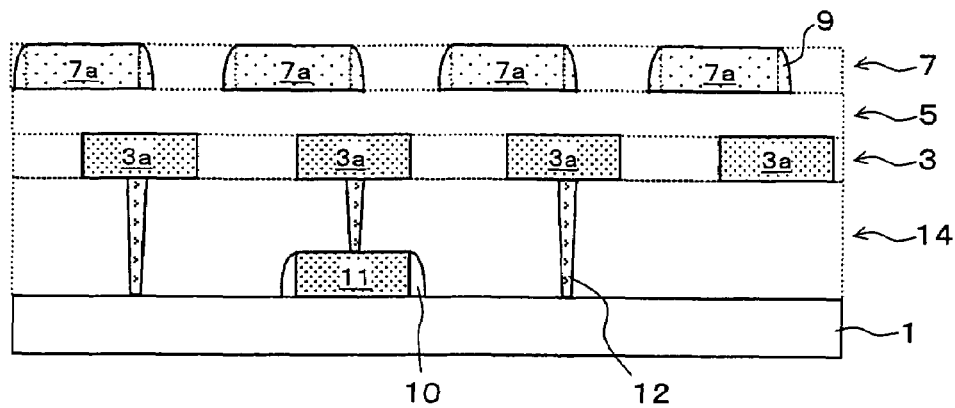
FIG. 4 is a sectional view illustrating the structure of a semiconductor device of an alternative embodiment of the invention and corresponding to the FIG. 1B.

As illustrated in FIG. 4, in an alternative embodiment, a first wiring layer 3 is formed on an insulating layer 14 covering gate wiring(s) 11, the gate wirings having sidewalls 10 and being formed on a semiconductor substrate 1. In this case, first wirings 3a are electrically connected to the gate wirings 11 and the semiconductor substrate 1 through contact plugs 12. The gate wirings 11 may be regarded as first wirings, or element isolating regions, active regions or other regions which are formed in the semiconductor substrate 1 may be regarded as first wirings.

Figure 5A:
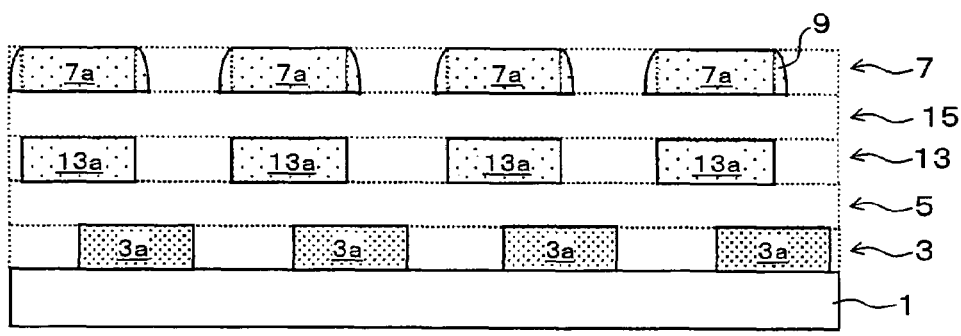
FIGS. 5A and 5B are each a sectional view illustrating the structure of a semiconductor device of an alternative embodiment of the invention and corresponding to the FIG. 1B.
Figure 5B:
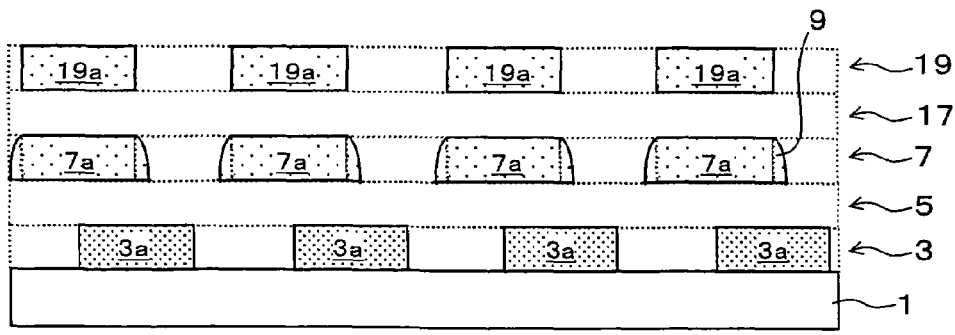

As illustrated in FIG. 5A, a further alternative embodiment may further have, over a first insulating layer 5, a third wiring layer 13 having third wiring(s) 13a and a second insulating layer 15 in this order between the first insulating layer 5 and a second wiring layer 7. As illustrated in FIG. 5B, an even further alternative embodiment may further have, over a second wiring layer 7, a third insulating layer 17 and a fourth wiring layer 19 having fourth wiring(s) 19a. Thus, embodiments having one or more wiring layers and the like in addition to the first and second wiring layers 5 and 7 are also included in the present invention.

Each of the insulating layers is made of an insulating material such as silicon oxide.

1-2. Description of Fine Projections

About each of the fine projections (also referred to as "fine projection") 9, it is sufficient that any one of the plane diameter and the section diameter thereof is 40 nm or less. It is preferred that both of them are 40 nm or less. The diameter of the sphere (circumscribed sphere) circumscribing the projection is preferably 40 nm or less.

The diameter of the fine projection 9 is preferably 40 nm, 35 nm, 30 nm, 25 nm, 20 nm, 15 nm, or 10 nm, or less than either of these (i.e. either of 40 nm or less, 35 nm or less, . . . , 10 nm or less). It is preferred that as the wavelength of inspecting light used in an appearance inspection is shorter, the diameter of the fine projection 9 is also made smaller. With reference to the above-mentioned expression (2), the following can be stated: it is preferred that the diameter d of the fine projection 9 satisfies the following: $d \leq \lambda \times 1/10$ wherein $\lambda$ represents the wavelength of light used in the inspection. When $\lambda$ is, for example, 190 nm, the expression is as follows: $d \leq 19$ nm; thus, it is preferred that the diameter of the fine projection 9 is 19 nm or less. From a different viewpoint, it is preferred that the plane diameter of the fine projection 9 is less than 1/2 of the interval between adjacent two out of the second wirings 7 in order to avoid a short circuit therebetween. It is necessary that the fine projection 9 has a certain degree of size, and it is preferred that the fine projection 9 has a size of 1 nm or more. In the specification, the word "fine projection(s)" refers to projection(s) which are purposely or artificially formed in order to cause Rayleigh scattering (that is, projection(s) for causing Rayleigh scattering). Irregularities of a rough face that may be generated at the time of dry etching or the like are not included in the category of the "fine projection(s)" referred to in the specification.

The shape of the fine projection 9 is not particularly limited, and examples thereof include a semispherical shape, a columnar shape and other various shapes.

Figure 6A:
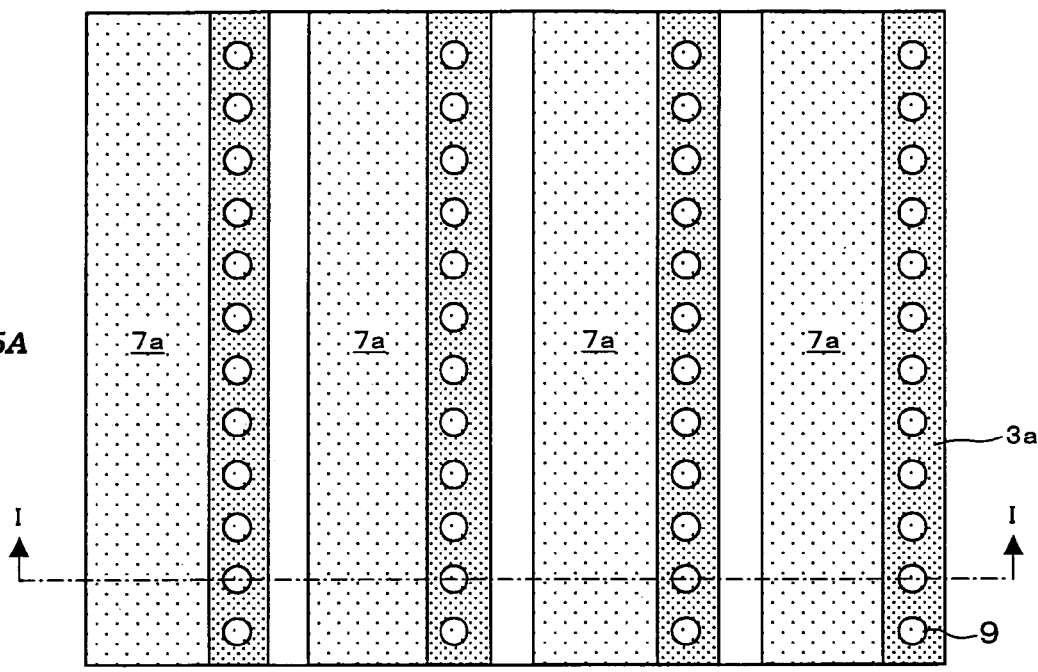
FIG. 6A is a plane view illustrating the structure of a semiconductor device of an alternative embodiment of the invention.
Figure 6B:
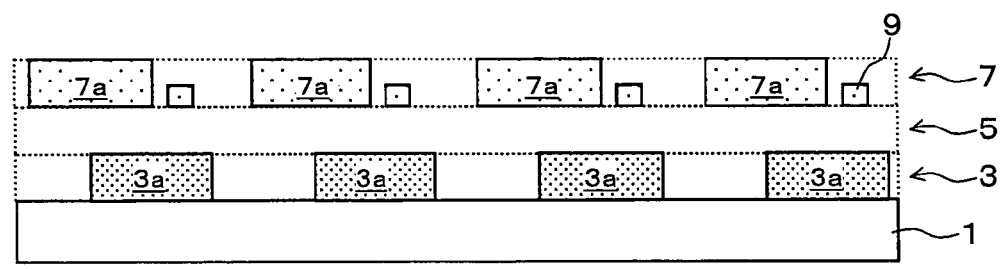
FIG. 6B is a sectional view taken on line I-I in FIG. 6A.

The fine projections 9 are preferably formed to be projected from a side face or side faces of the second wirings 7a, and-are more preferably formed to be projected from a side face or side faces of the second wirings 7a substantially perpendicularly thereto. The fine projections 9 are preferably formed at substantially regular intervals. As illustrated in FIGS. 6A or 6B, in an alternative embodiment, fine projections 9 are formed between adjacent two out of second wirings 7a. The fine projections 9 are formed in an island form. These fine projections 9 also-cause Rayleigh scattering. The fine projections 9 are preferably formed at the center in the width direction of exposed portions of the first wirings 3a since reflected light from the first wirings 3a is effectively shaded in this case. The fine projections 9 may be formed at the center of adjacent two out of the second wirings 7a. In this case, an influence of Rayleigh scattered light on an appearance inspection of the second wirings 7a can be made small. The fine projections 9 may be formed in a single line or in two or more lines. As illustrated in FIG. 6B, the thickness of the fine projections 9 are smaller than that of the second wirings 7a. In such a structure, both of the plane diameter and the section diameter of the fine projections 9 can be set to 40 nm or less, so that Rayleigh scattering can be effectively caused.

In a further alternative embodiment, fine projections 9 can be formed in an upper layer of a second wiring layer 7. Specifically, as illustrated in FIGS. 7A to 7C (FIG. 7B and 7C are each a sectional view taken on line I-I in FIG. 7A), for example, fine projections 9 are each formed over a space between adjacent two out of second wirings 7a. As illustrated in FIG. 7B, the fine projections 9 may be formed on the upper surface of a second wiring layer 7. As illustrated in FIG. 7C, the fine projections 9 may be formed by making concaves in a third insulating layer 17 on the second wiring layer 7 and then embedding a fine-projection-forming material into the concaves. In any one of these cases, an influence of reflected light from first wirings 3a can be restrained by Rayleigh scattered light caused by the fine projections 9.

When the fine projections 9 are formed in an upper layer of the second wiring layer 7, it is preferred that the section diameter of the fine projections 9 is less than ½ of the thickness of the third insulating layer 17. This is because short circuit of wirings can be avoided between the second wiring layer 7 and a wiring layer (for example, a fourth wiring layer 19 in FIG. 5B) over the layer 7. As illustrated in FIGS. 8A and 8B, in an alternative embodiment, fine projections 9 may be formed to be dispersed in the whole of the upper face of a second wiring layer 7. The fine projections 9 may be formed only at edges of the upper faces of second wirings 7a, or may be formed only in the upper faces of the second wirings 7a. It is however preferred that the fine projections 9 are each formed in a space between adjacent two out of the second wirings 7a or over the space in order to make an appearance inspection of the second wiring layer 7 with a high precision.

The material for forming the fine projections 9 may be the same as for forming the second wirings 7a, the same as for forming the first insulating layer 5, or a material different from the materials for forming the second wirings 7a and the first insulating layer 5.

The fine projections 9 may be removed after an appearance inspection since the projections 9 become unnecessary after the appearance inspection. The fine projections 9 may be left as they are.

2. Semiconductor Device Producing Process

With reference to the attached drawings, examples of the process for producing the semiconductor device of an embodiment of the invention will be described hereinafter. In the invention, fine projections may be made of the same material as for second wirings, the same material as for a first insulating layer, or a material different from materials for the second wirings and the first insulating layer; therefore, the examples which will be described are concerned with processes for producing semiconductor devices having fine projections made of these respective materials.

2-1. The Same Material as for Second Wirings

A process for forming fine projections by use of the same material as for second wirings will be described hereinafter.

(1) First Process

A process described herein with reference to FIGS. 9A to 9D is a method for producing a semiconductor device as illustrated in FIGS. 1A and 1B. FIGS. 9A to 9D are each a view of a section equivalent to the section illustrated in FIG. 1B.

Figure 9A:
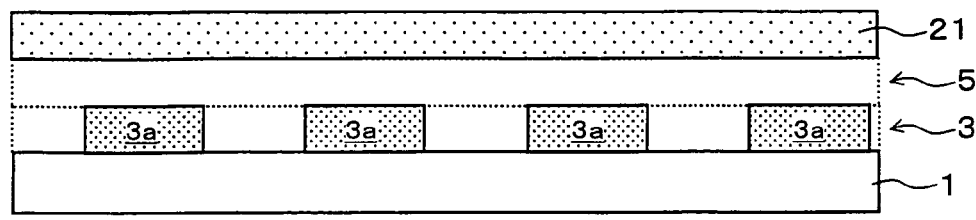
FIGS. 9A to 9D are sectional views illustrating steps for producing a semiconductor device of an embodiment of the invention and corresponding to FIG. 1B.

As illustrated in FIG. 9A, a first conductor layer made of Al—Cu alloy is firstly formed on a semiconductor substrate 1 by sputtering. This layer is patterned to form first wirings 3a. Next, an insulating material such as silicon oxide is deposited onto the resultant substrate to fill the insulating material into a space between adjacent two out of the first wirings 3a, thereby forming a first wiring layer 3, and further form a first insulating layer 5 on the first wiring layer 3. Furthermore, a second conductor layer 21 made of Al—Cu alloy or the like is formed on the resultant substrate by sputtering. Through the steps described up to here, a structure illustrated in FIG. 9A is obtained. The materials for the wiring layer and the insulating layer may be appropriately changed. For example, in the case where wirings made of an insulating material are required, a layer made of a desired insulating material is formed instead of the above-mentioned conductor layer. The methods for forming the films may be appropriately changed to a vapor deposition process, a CVD process, or the like. These descriptions can be correspondingly applied to steps that-will be described hereinafter.

Figure 9B:
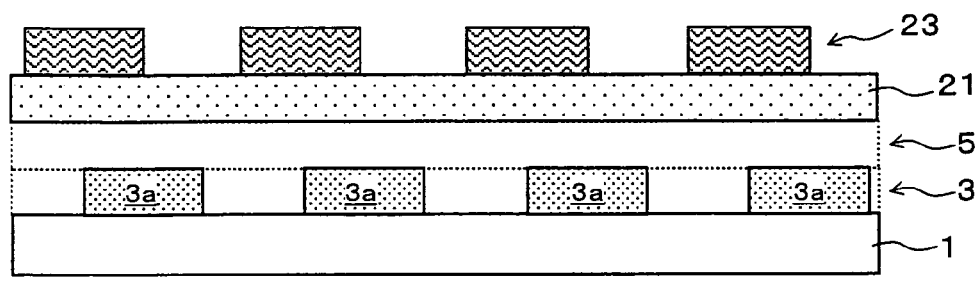

Next, a resist pattern 23 is formed on the second conductor layer 21, thereby yielding a structure illustrated in FIG. 9B.

Figure 9C:
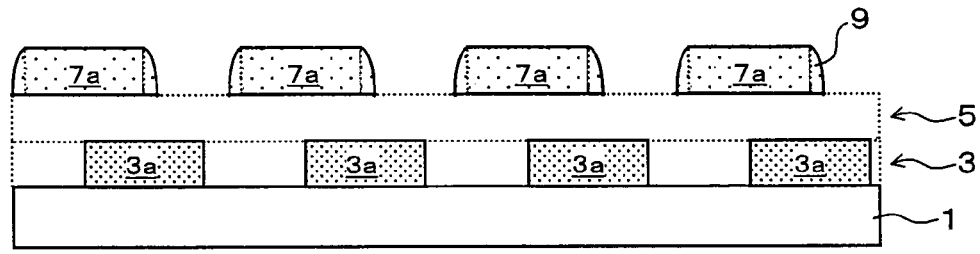

Next, the resist pattern 23 is used as a mask to pattern the second conductor layer 21 by dry etching, so as to form second wirings 7a and further form fine projections 9 on side faces of the second wirings 7a, thereby yielding a structure illustrated in FIG. 9C. The etching is performed by using an etching gas containing $CHF_3$ gas. $CHF_3$ gas has a property of forming depositions on a surface when used for etching, therefore, when the content of this gas is adjusted, the side faces of the second wirings 7a can be partially protected. The protected portions become the fine projections 9. When the content of $CHF_3$ gas or etching conditions are varied, the size of the fine projections 9, the number density thereof (i.e., the number thereof per unit area), and others can be adjusted.

Figure 9D:
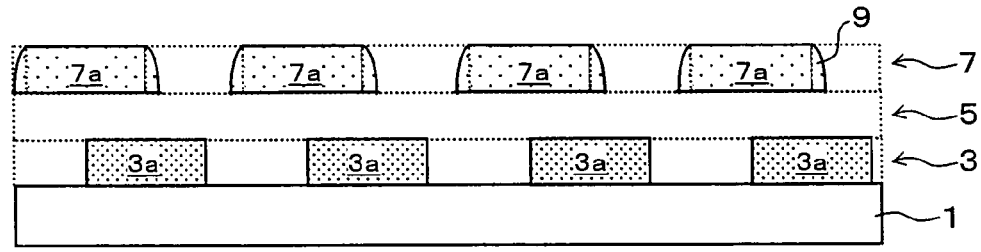

Next, an insulating material such as silicon oxide is embedded into a space between adjacent two out of the second wirings 7a, thereby yielding a structure illustrated in FIG. 9D. In this way, a semiconductor device as illustrated in FIGS. 1A and 1B is yielded.

(2) Second Process

With reference to FIGS. 10A to 10E and FIGS. 11F to 11I, which are each a view of a section equivalent to the section illustrated in FIG. 6B, a process for producing a semiconductor device as illustrated in FIGS. 6A and 6B is described herein.

Figure 10A:
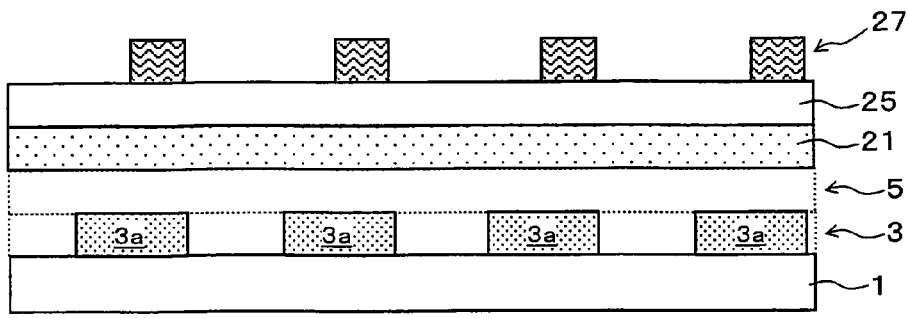
FIGS. 10A to 10E are sectional views illustrating steps for producing a semiconductor device of an alternative embodiment of the invention and corresponding to FIG. 1B.

As illustrated in FIG. 10A, in the same way as described above, steps up to the formation of a second conductor layer 21 are firstly performed. Next, an insulating layer 25 made of silicon oxide or the like is formed on the second conductor layer 21. Next, a first resist pattern 27 for forming fine projections is formed on the insulating layer 25. The first resist pattern 27 is formed in such a manner that pattern pieces thereof are disposed at sites where the fine projections are to be formed and each have a larger two-dimensional area (i.e. area in a plane view) than each of the fine projections to be formed. Through the steps described up to here, a structure illustrated in FIG. 10A is yielded.

Figure 10B:
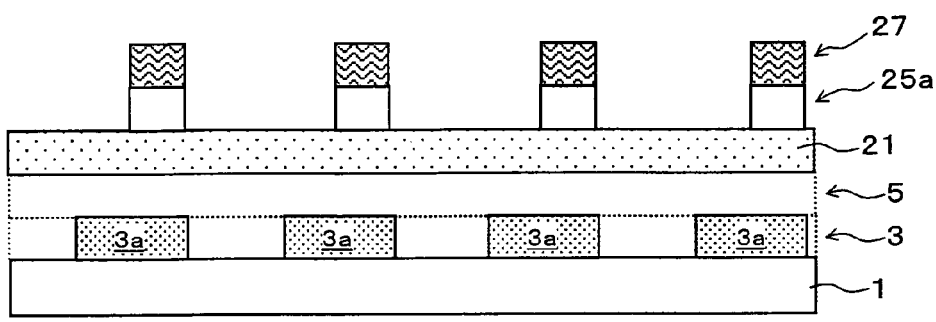

Next, the first resist pattern 27 is used as a mask to pattern the insulating layer 25, thereby forming an insulating layer pattern 25a. In this way, a structure illustrated in FIG. 10B is yielded.

Figure 10C:
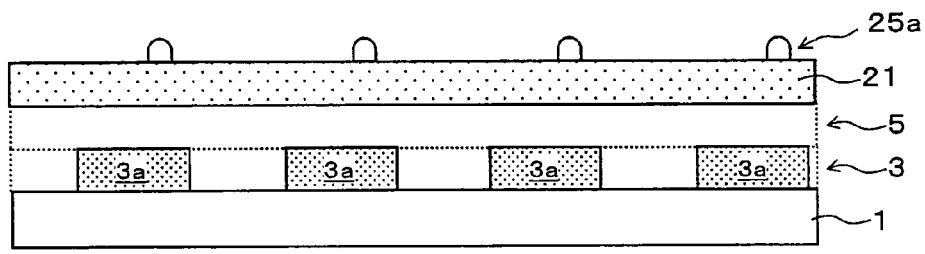

Next, the first resist pattern 27 is removed, and then the insulating layer pattern 25a is subjected to isotropic etching (for example, wet etching) to shrink the insulating layer pattern 25a, thereby yielding a structure illustrated in FIG. 10C.

Figure 10D:
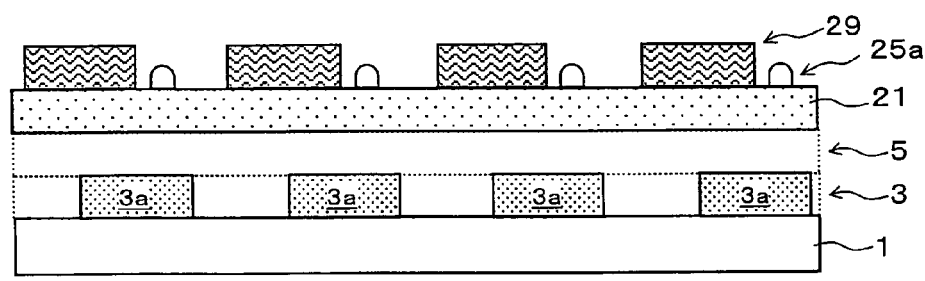

Next, a second resist pattern 29 is formed on the resultant substrate to yield a structure illustrated in FIG. 10D.

Figure 10E:
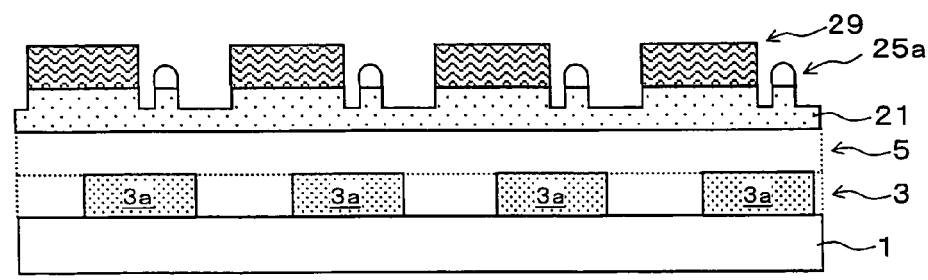

Next, the insulating layer pattern 25a and the second resist pattern 29 are used as masks to subject the second conductor layer 21 to anisotropic etching until the layer 21 is halfway (i.e. not completely) etched, thereby yielding a structure illustrated in FIG. 10E.

Figure 11F:
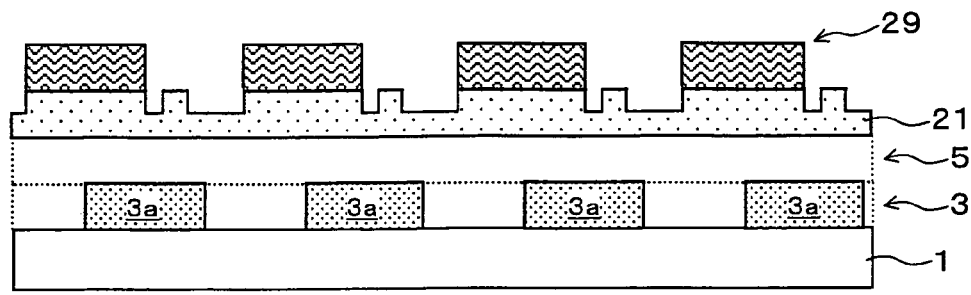
FIG. 11F to 11I are sectional views illustrating the semiconductor device producing steps which follow the step illustrated in FIG. 10E and corresponding to FIG. 1B.

Next, the insulating layer pattern 25a is removed by anisotropic etching, thereby yielding a structure illustrated in FIG. 11F. Isotropic etching may be employed.

Figure 11G:
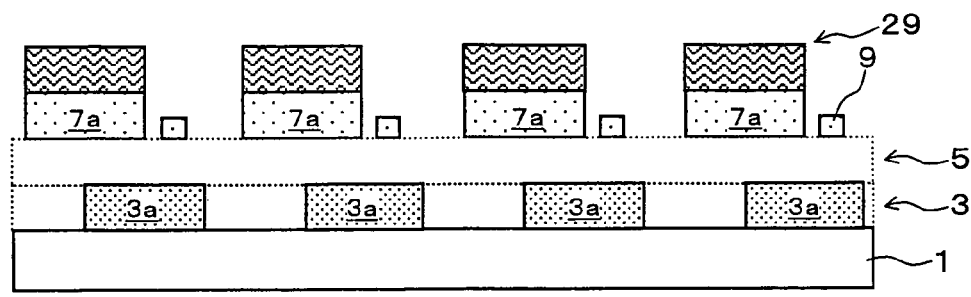

Next, the second resist pattern 29 is used as a mask to subject the second conductor layer 21 to anisotropic etching up to the last stage of the etching of the layer 21, thereby forming second wirings 7a and fine projections 9. In this way, a structure illustrated in FIG. 11G is yielded.

Figure 11H:
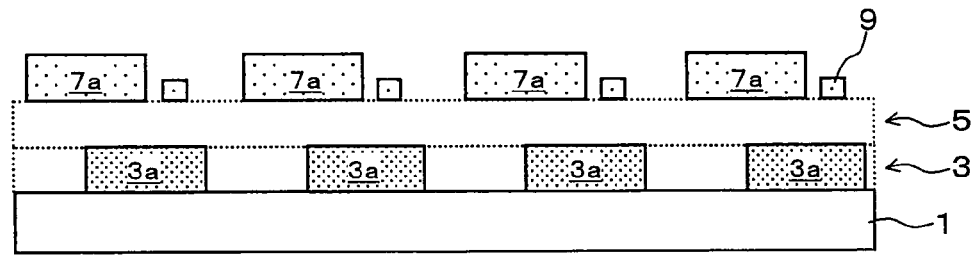

Next, the second resist pattern 29 is removed to yield a structure illustrated in FIG. 11H.

Figure 11I:
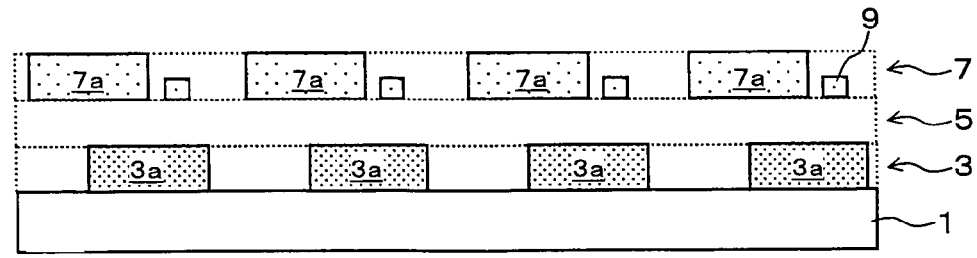

Next, an insulating material such as silicon oxide is embedded into a space between adjacent two out of the second wirings 7a to form a second wiring layer 7, thereby yielding a structure illustrated in FIG. 11I. In this way, a semiconductor device as illustrated in FIGS. 6A and 6B is yielded.

The size, the position, the number density, or some other property of the fine projections 9 can be adjusted by adjusting the size, the position, or the number density, or some other property of the first resist pattern 27, or adjusting conditions for the isotropic etching. The height of the fine projections 9 can be adjusted by adjusting the quantity of the etching performed by use of the insulating layer pattern 25a and the second resist pattern 29 as the masks.

2-2. The Same Material as for a First Insulating Layer

With reference to FIGS. 12A to 12E, a process for producing a semiconductor device having fine projections made of the same material as for a first insulating layer is described herein.

In the same way as in the above-mentioned item "2-1. (1) First process", the steps up to the formation of the structure illustrated in FIG. 9B are firstly performed.

Figure 12A:
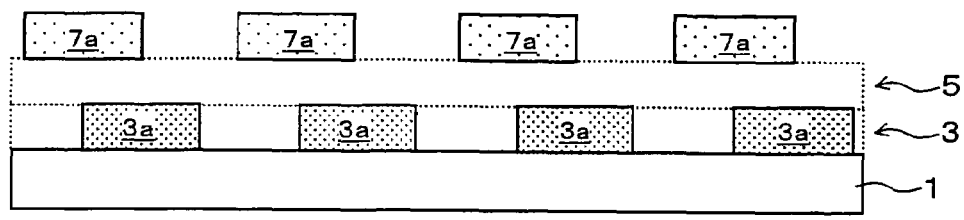
FIGS. 12A to 12E are sectional views illustrating steps for producing a semiconductor device of an alternative embodiment of the invention and corresponding to FIG. 1B.

Next, the second conductor layer 21 is etched without incorporating $CHF_3$ gas into etching gas, so as to yield a structure illustrated in FIG. 12A.

Figure 12B:
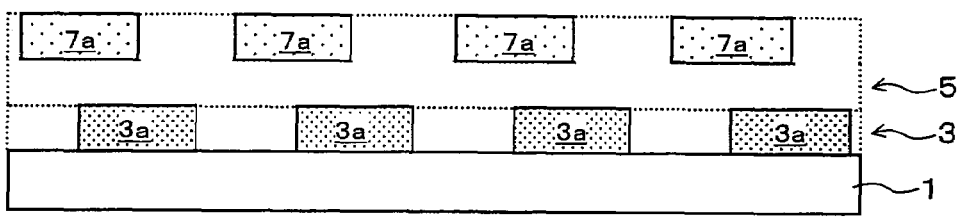
Figure 12C:
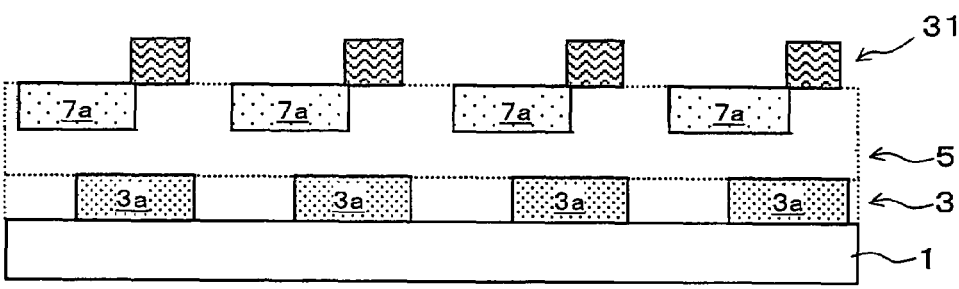

Next, the same material as for the first insulating layer 5 is embedded into a space between adjacent two out of the second wirings 7a to yield a structure illustrated in FIG. 12B.

Next, a resist pattern 31 for forming fine projections is formed on the resultant substrate. The resist pattern 31 is formed in such a manner that pattern pieces thereof are disposed at sites where the fine projections are to be formed and each have a larger two-dimensional area than each of the fine projections to be formed.

Figure 12D:
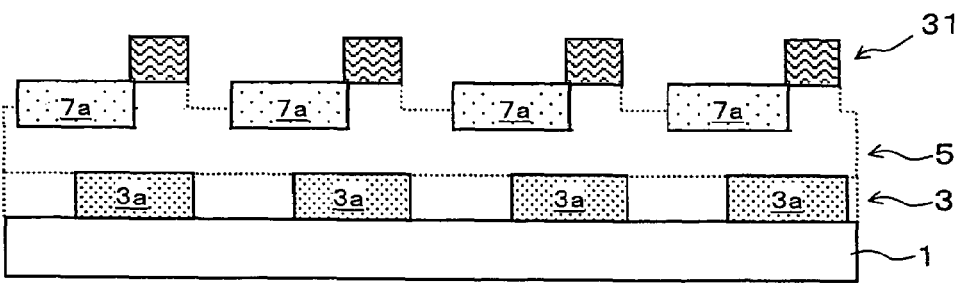

Next, the resist pattern 31 is used as a mask to etch anisotropically the insulating material embedded into the space between adjacent two out of the second wirings 7a until the insulating material is halfway etched. In this way, a structure illustrated in FIG. 12D is yielded.

Figure 12E:
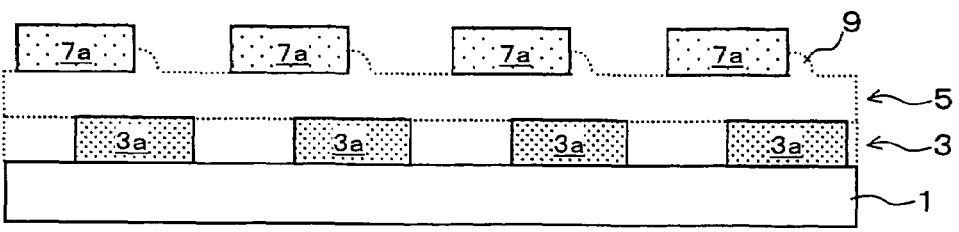

Next, the resist pattern 31 is removed and then the insulating material is isotropically etched to form fine projections 9, thereby yielding a structure illustrated in FIG. 12E.

Thereafter, an insulating material having a refractive index different from that of the material for the first insulating layer 5 is embedded into a space between adjacent two out of the second wirings 7a to complete a production of a semiconductor device of an embodiment of the invention.

The size, the position, the number density, or some other property of the fine projections 9 can be adjusted by adjusting the size, the position, or the number density, or some other property of the resist pattern 31, or adjusting conditions for the isotropic etching. The height of the fine projections 9 can be adjusted by adjusting the etching quantity of the anisotropic etching of the insulating material.

2-3. Different Material

A method for forming fine projections by use of a material different from materials for second wirings and a first insulating-layer is described herein.

(1) First Process

With reference to FIGS. 13A to 13D and FIGS. 14A and 14B, a first process is described herein.

In the same way as in the above-mentioned item "2-2. (1) The same material as for a first insulating layer", the steps up to the formation of the structure illustrated in FIG. 12A are firstly performed. Next, an insulating layer made of a first insulating material (such as silicon oxide) is formed by a CVD process, which is an isotropic film forming process, and further this insulating layer is anisotropically etched to form sidewalls 33 onto side faces of the second wirings 7a, thereby yielding a structure illustrated in FIG. 13A.

Figure 13A:
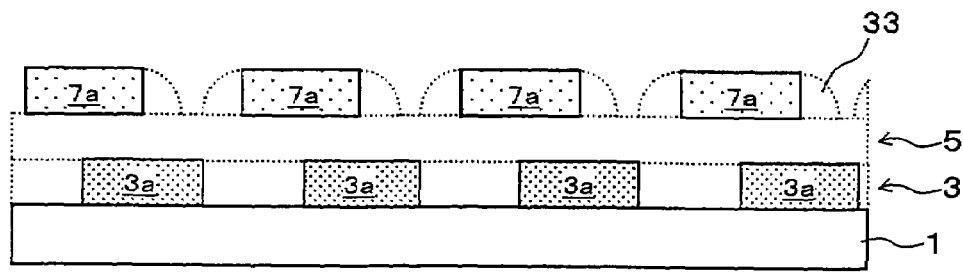
FIGS. 13A to 13D are sectional views illustrating steps for producing a semiconductor device of an alternative embodiment of the invention and corresponding to FIG. 1B.
Figure 13B:
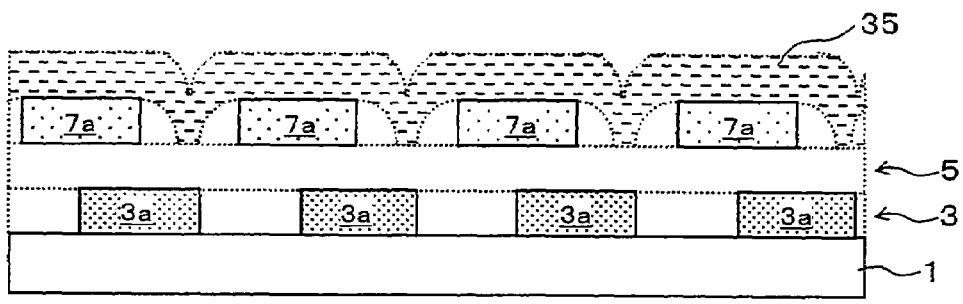
Figure 13C:
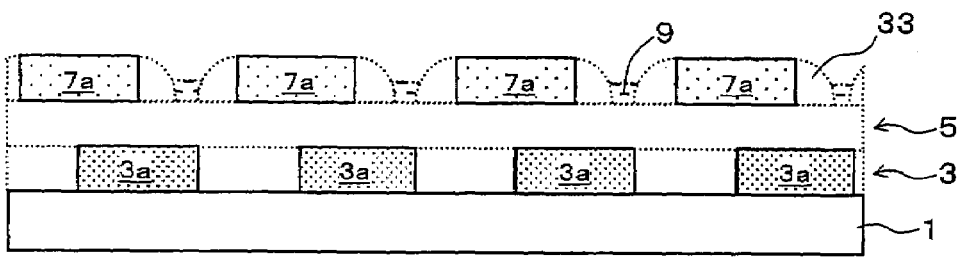

Next, an insulating layer 35 made of a second insulating material (such as silicon nitride) is formed by a CVD process, so as to yield a structure illustrated in FIG. 13B.

Figure 14A:
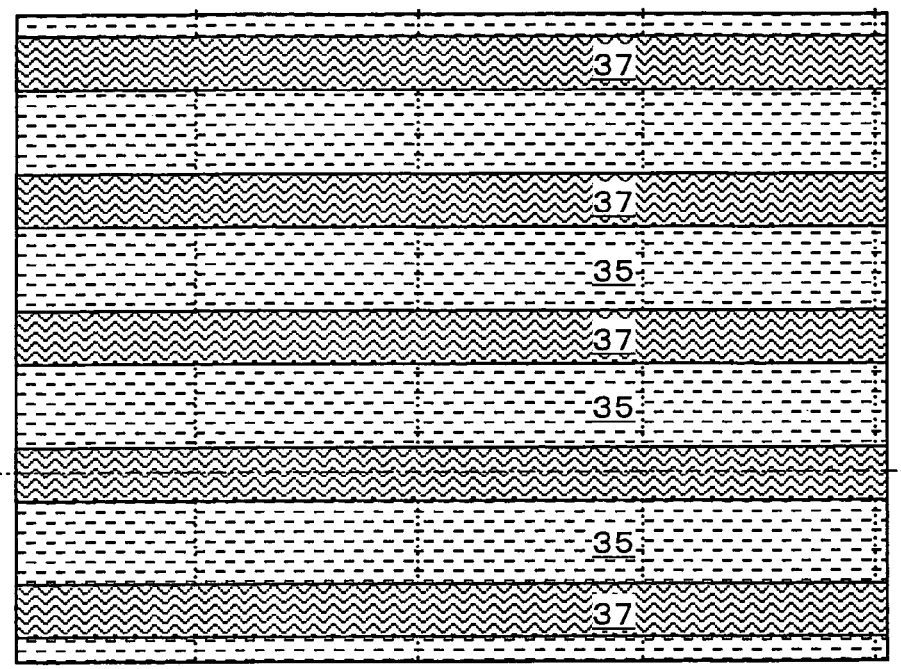
FIG. 14A is a plane view illustrating a semiconductor device producing step to be positioned between the steps illustrated in FIGS. 13B and 13C.
Figure 14B:
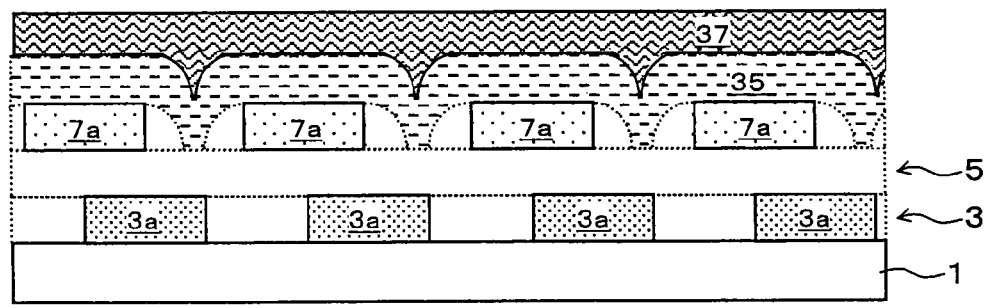
FIG. 14B is a sectional view taken on line I-I in FIG. 14A.

As illustrated in FIGS. 14A and 14B, next, a resist pattern 37 is formed which extends substantially perpendicularly to the second wirings 7a.

Next, the resist pattern 37 is used as a mask to pattern the insulating layer 35. Furthermore, the patterned insulating layer 35 is isotropically etched to yield a structure illustrated in FIG. 13C. The isotropic etching is performed using, for example, phosphoric acid or HF in such a manner that the insulating layer 35 is partially left as the fine projections 9 between facing two of the sidewalls 33.

Figure 13D:
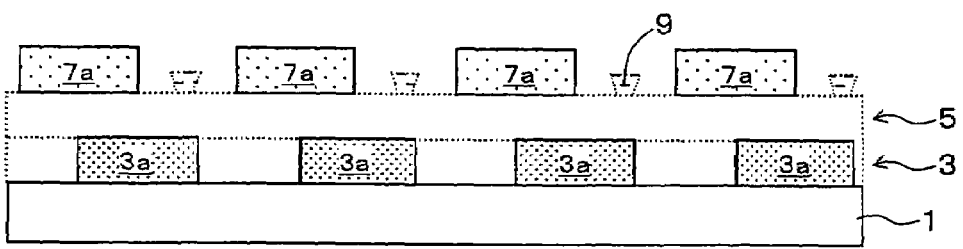

Next, the sidewalls 33 are removed by etching (for example, dry etching), so as to yield a structure illustrated in FIG. 13D. Thereafter, an insulating material having a refractive index different from that of the second insulating material is embedded into a space between adjacent two out of the second wirings 7a to complete a production of a semiconductor device of an embodiment of the invention.

The size, the position, the number density, or some other property of the fine projections 9 can be adjusted by changing the sidewalls 33, the resist pattern 37, conditions for the etchings, or the like.

(2) Second Process

With reference to FIGS. 15A and 15B and FIGS. 16A and 16B, a second process is described herein.

In the same way as in the above-mentioned item "2-2. (1) The same material as for a first insulating layer", the steps up to the formation of the structure illustrated in FIG. 12A are firstly performed. Next, an insulating layer made of an insulating material (such as silicon nitride) is formed by a CVD process, which is an isotropic film forming process, and further this insulating layer is anisotropically etched to form sidewalls 39 onto side faces of the second wirings 7a, thereby yielding a structure illustrated in FIG. 15A.

Figure 16A:
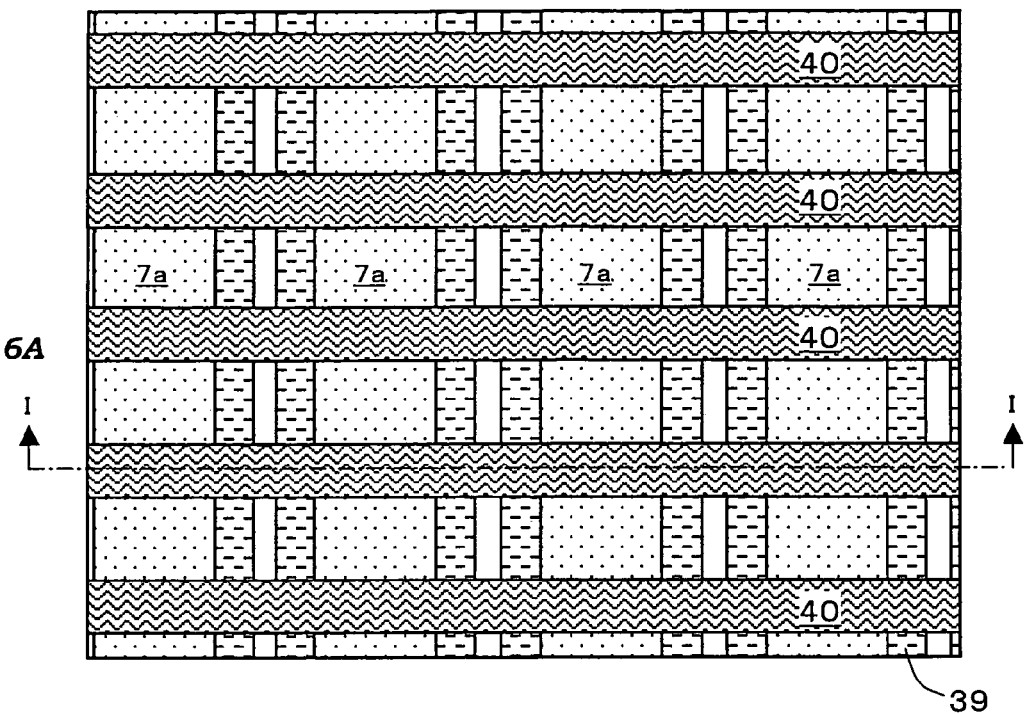
FIG. 16A is a plane view illustrating a semiconductor device producing step to be positioned between the steps illustrated in FIGS. 15A and 15B.
Figure 16B:
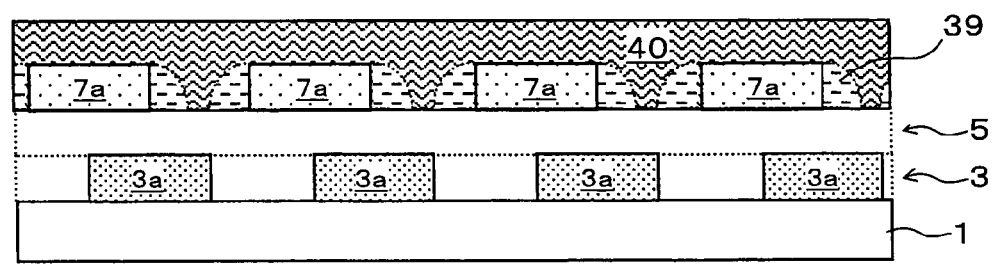
FIG. 16B is a sectional view taken on line I-I in FIG. 16A.

As illustrated in FIGS. 16A and 16B, next, a resist pattern 40 is formed which extends substantially perpendicularly to the second wirings 7a.

Figure 15A:
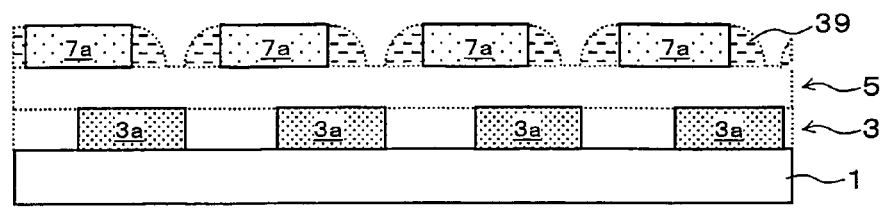
FIGS. 15A to 15B are sectional views illustrating steps for producing a semiconductor device of an alternative embodiment of the invention and corresponding to FIG. 1B.
Figure 15B:
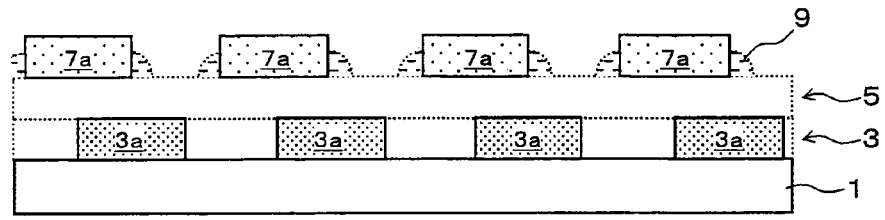

Next, the resist pattern 40 is used as a mask to pattern the sidewalls 39. Furthermore, the patterned sidewalls 39 are isotropically etched to reduce the size thereof, thereby forming fine projections 9. In this way, a structure illustrated in FIG. 15B is yielded. The isotropic etching is performed by use of, for example, phosphoric acid or HF.

Thereafter, an insulating material having a refractive index different from that of the insulating material for the fine projections 9 is embedded into a space between adjacent two out of the second wirings 7a to complete a production of a semiconductor device of an embodiment of the invention.

The size, the position, the number density, or some other property of the fine projections 9 can be adjusted by changing the sidewalls 39, the resist pattern 40, conditions for the etchings, or the like.

(3) Third Process

With reference to FIGS. 17A to 17D and FIGS. 18A and 18B, a third process is described herein.

In the same way as in the above-mentioned item "2-2. The same material as for a first insulating layer", the steps up to the formation of the structure illustrated in FIG. 12A are firstly performed. Next, an insulating layer 41 made of an insulating material (such as silicon nitride) is formed by a CVD process, which is an isotropic film forming process, thereby yielding a structure illustrated in FIG. 17A.

Figure 18A:
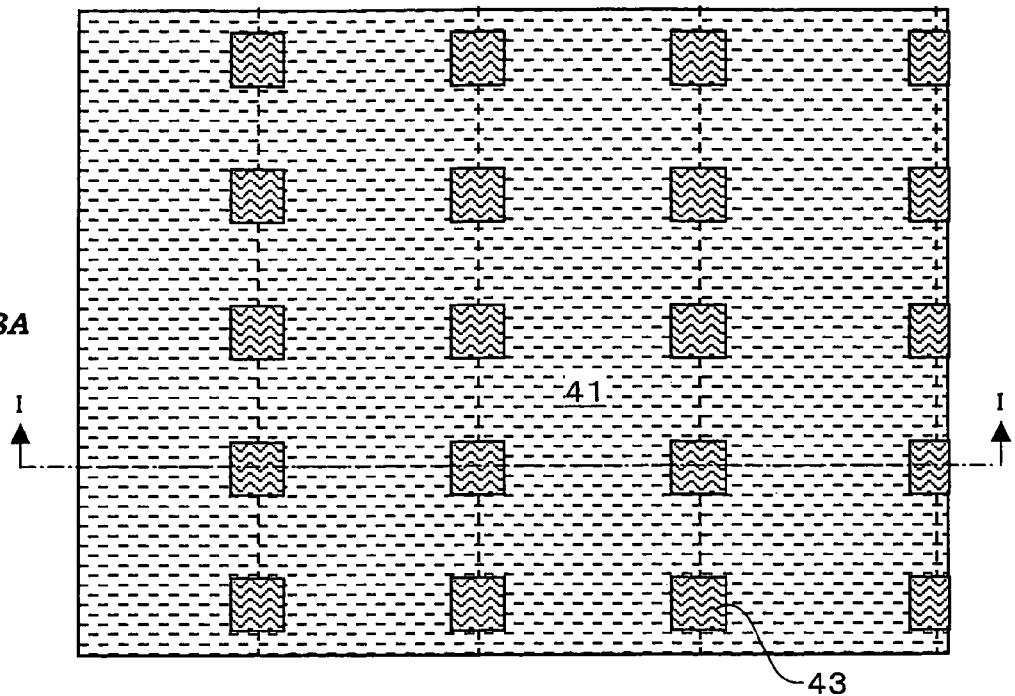
FIG. 18A is a plane view illustrating a semiconductor device producing step to be positioned between the steps illustrated in FIGS. 17A and 17B.
Figure 18B:
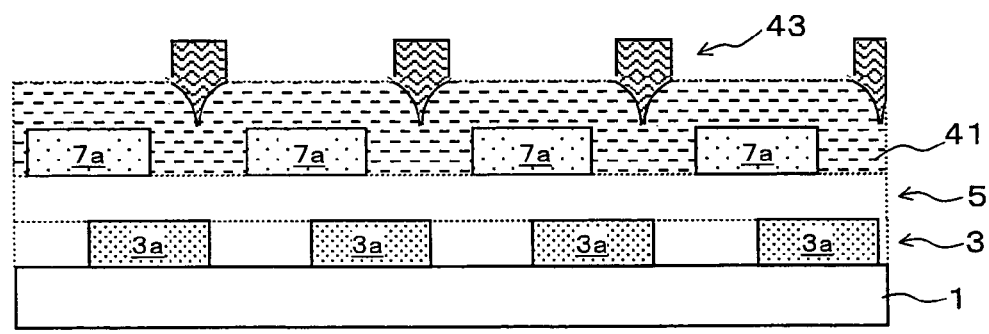
FIG. 18B is a sectional view taken on line I-I in FIG. 18A.

As illustrated in FIGS. 18A and 18B, next, an resist pattern 43 for forming fine projections is formed on the insulating layer 41. The resist pattern 43 has island-shaped pattern pieces. These pattern pieces are uniformly distributed in the center of each region between adjacent two out of the second wirings 7a.

Figure 17A:
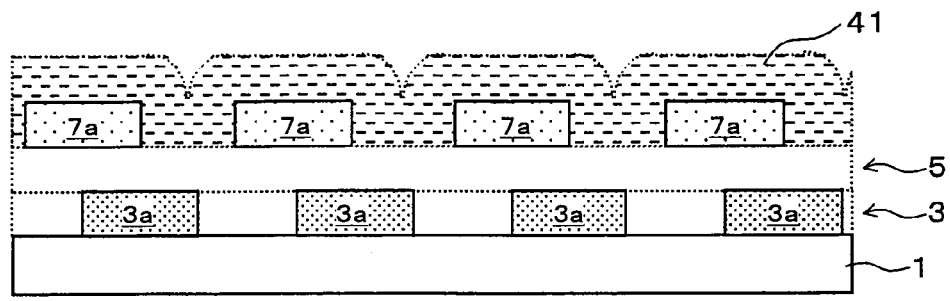
FIGS. 17A to 17D are sectional views illustrating steps for producing a semiconductor device of an alternative embodiment of the invention and corresponding to FIG. 1B.
Figure 17B:
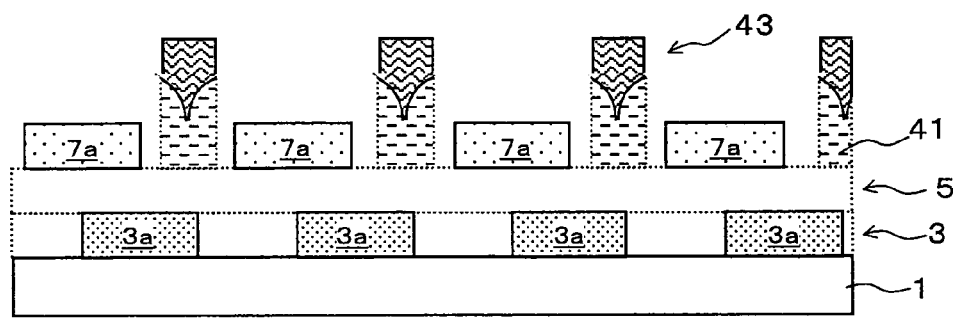

Next, the resist pattern 43 is used as a mask to pattern the insulating layer 41, thereby yielding a structure illustrated in FIG. 17B.

Figure 17C:
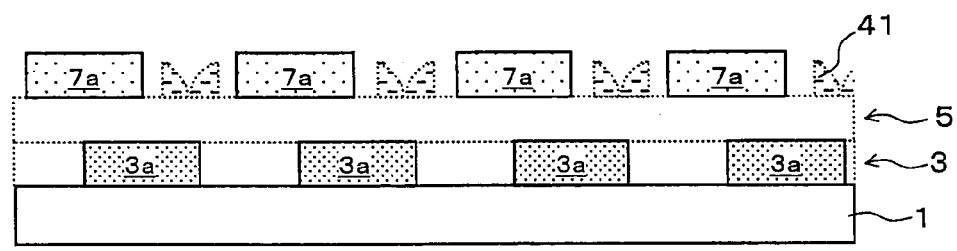

Next, the resist pattern 43 is removed and the patterned insulating layer 41 is anisotropically etched to decrease the height thereof, thereby yielding a structure illustrated in FIG. 17C.

Figure 17D:
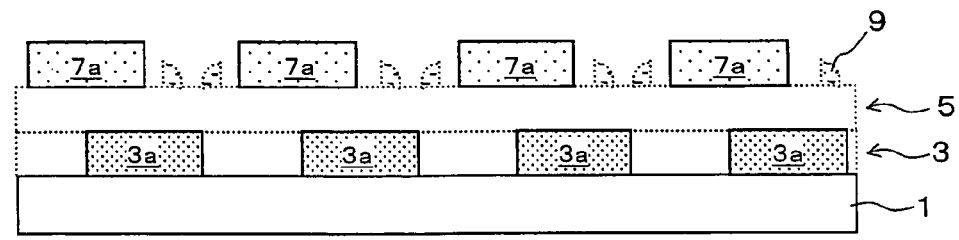

Next, the resultant insulating layer 41 is isotropically etched to reduce the size thereof, thereby forming fine projections 9. In this way, a structure illustrated in FIG. 17D is yielded. The isotopic etching is performed by use of, for example, phosphoric acid or HF.

Thereafter, an insulating material having a refractive index different from that of the insulating material for the fine projections 9 is embedded into a space between adjacent two out of the second wirings 7a to complete a production of a semiconductor device of an embodiment of the invention.

The size, the position, the number density, or some other property of the fine projections 9 can be adjusted by changing the resist pattern 43, conditions for the etchings, or the like.

3. Appearance Inspecting Method for Semiconductor Device

3-1. Appearance Inspection

The following will describe a method for inspecting the appearance of the above-mentioned semiconductor device. The semiconductor device illustrated in FIGS. 1A and 1B is used as an example to describe this method.

Figure 19A:
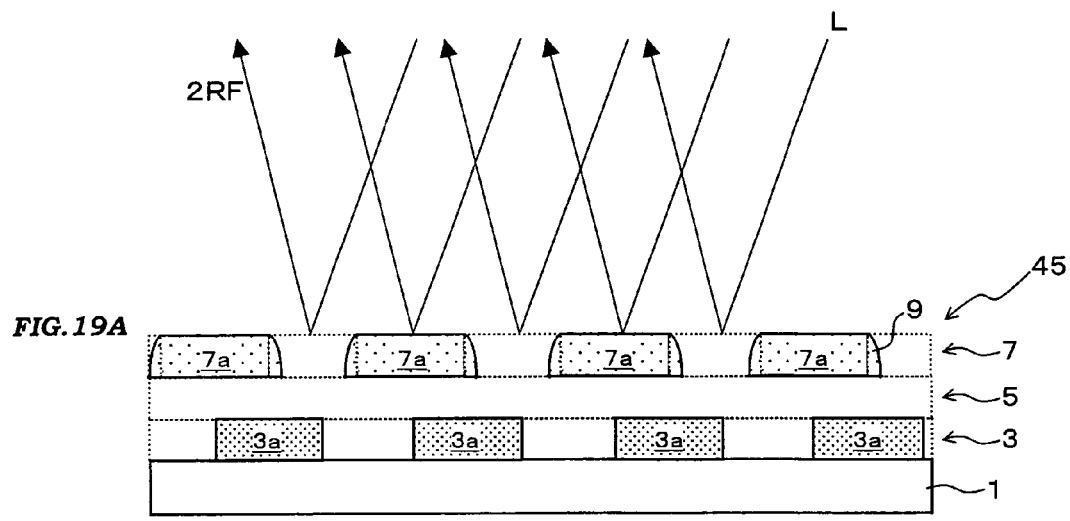
FIGS. 19A to 19C are each a sectional view, which corresponds to FIG. 1B, for explaining the principle of the method for inspecting an appearance of a semiconductor device according to an embodiment of the invention.

As illustrated in FIG. 19A, the method for inspecting an appearance of a semiconductor device according to an embodiment of the invention comprises the step of: radiating inspecting light L composed of ultraviolet light to a semiconductor device 45 to cause Rayleigh scattering on fine projections 9 while causing the inspecting light L to be reflected on the surface of a second wiring layer 7; receiving light 2RF reflected on the surface of the second wiring layer 7 by means of an image pickup element; and making an appearance inspection of the second wiring layer 7 on the basis of data obtained from the received light.

Figure 19B:
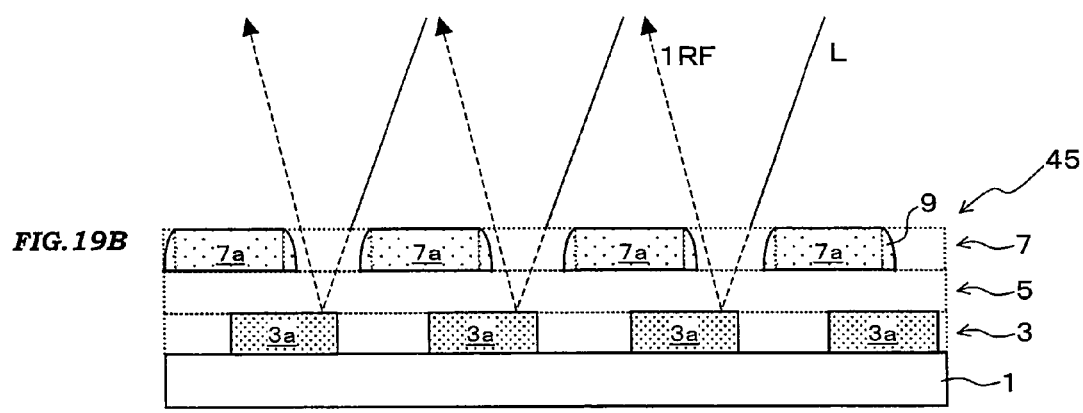

When the inspecting light L is radiated to the semiconductor device 45, a large portion of the light is reflected on the surface of the second wiring layer 7. The reflected light 2RF is received by means of the image pickup element, whereby data on the surface state of the second wiring layer 7 are obtained. As a result, an appearance inspection of the second wiring layer 7 is made. If the light is totally reflected on the surface of the second wiring layer 7, the appearance inspection of the second wiring layer 7 can be made with a high precision. However, in reality, as illustrated in FIG. 19B, some portion of the light L is not reflected on the surface of the second wiring layer 7, passes through a first insulating layer 5, and reach a first wiring layer 3, and is reflected on the surface of the first wiring layer 3. The reflected light (referred to as "1RF") from the first wiring layer 3 can be received by means of the image pickup element. Therefore, for example, if defects are present on the surface of the first wirings 3a, light reflected on the defects is received by means of the image pickup element. Then, the defects are recognized as defects in the second wiring layer 7. Therefore, the reflected light 1RF can lower the-precision of the appearance inspection of the second wiring layer 7. In a conventional semiconductor device, the precision of an appearance inspection for the device has been lowered due to the influence of such reflected light from an underlying layer.

Figure 19C:
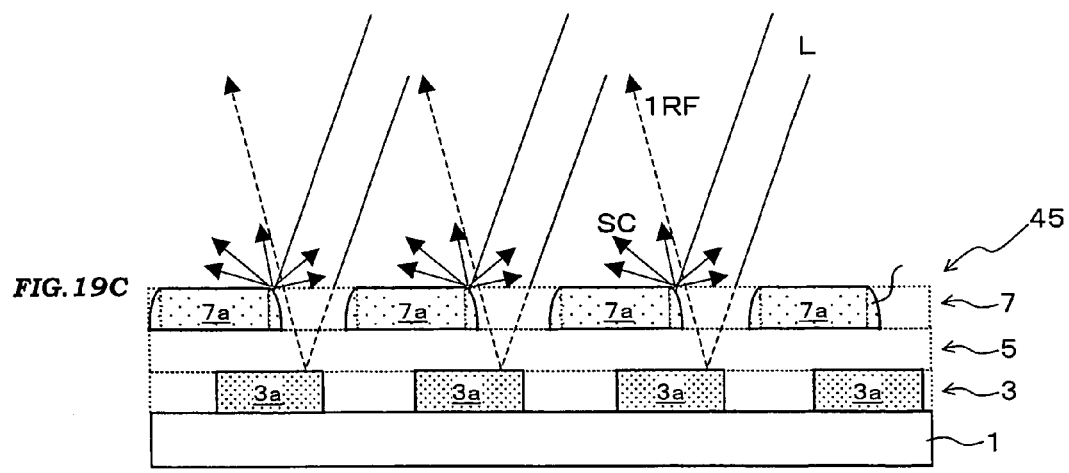

The semiconductor device of an embodiment of the invention has fine projections 9 on its second wiring layer or an upper layer thereof. The fine projections are small sufficiently to cause the inspecting light composed of ultraviolet light to undergo Rayleigh scattering. Accordingly, when the inspecting light L is radiated to the fine projections 9, Rayleigh scattered light SC is generated as illustrated in FIG. 19C. By an influence of the Rayleigh scattered light SC, a portion of reflected light 1RF from the first wiring layer 3, the portion passing through spaces near the fine projections 9, is not substantially recognized by the image pickup element, and thus does not affect the appearance inspection of the second wiring layer 7. By such a principle, the precision of the appearance inspection of the second wiring layer 7 is improved according to an embodiment of the invention.

The inspecting light L may be light made of light having a substantially single wavelength, or synthetic light composed of light having plural wavelengths (i.e. having peaks at plural wavelengths) different from each other. In any one of these cases, an embodiment of invention can be carried out. In the case of the synthetic light, given is an advantage that the intensity of the light to be radiated is easily made higher.

The inspecting light L may be radiated obliquely to the surface of the second wiring layer 7, or may be radiated substantially perpendicularly to the surface of the second wiring layer 7. The image pickup element may be disposed to oppose the light receiving face thereof to the second wiring layer surface, or to make the light receiving face oblique to the second wiring layer surface. When the light is obliquely radiated or the second wiring layer 7 is obliquely observed, an advantage that data on irregularities in the surface are easily obtained is given. When the light is perpendicularly radiated or the second wiring layer 7 is perpendicularly observed, an advantage that data on positions of defects are easily obtained is given.

The appearance inspection of the second wiring layer may be performed by pattern-comparison or by observing, with the naked eye, an image displayed in a monitor. The image is generated on the basis of data from the light received by means of the image pickup element.

The inspection of an embodiment of the invention may be made under the atmospheric pressure or under a reduced pressure. When the inspection is performed under a reduced pressure, Rayleigh scattering of the inspecting light based on molecules in the atmosphere can be decreased so that the precision of the inspection can be improved.

The inspection of an embodiment of the invention is made in an atmosphere having a refractive index different from that of the fine projections 9. If the refractive index of the atmosphere where the inspection is made is equal to that of the fine projections 9, scattering does not effectively occurs.

Figure 20A:
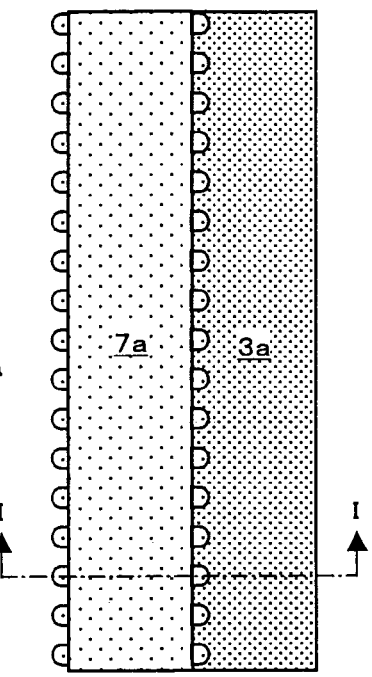
FIG. 20A is a plane view illustrating the structure of a semiconductor device of an example of the invention.
Figure 20B:
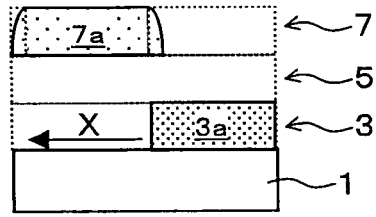
FIG. 20B is a sectional view taken on line I-I in FIG. 20A.
Figure 21:
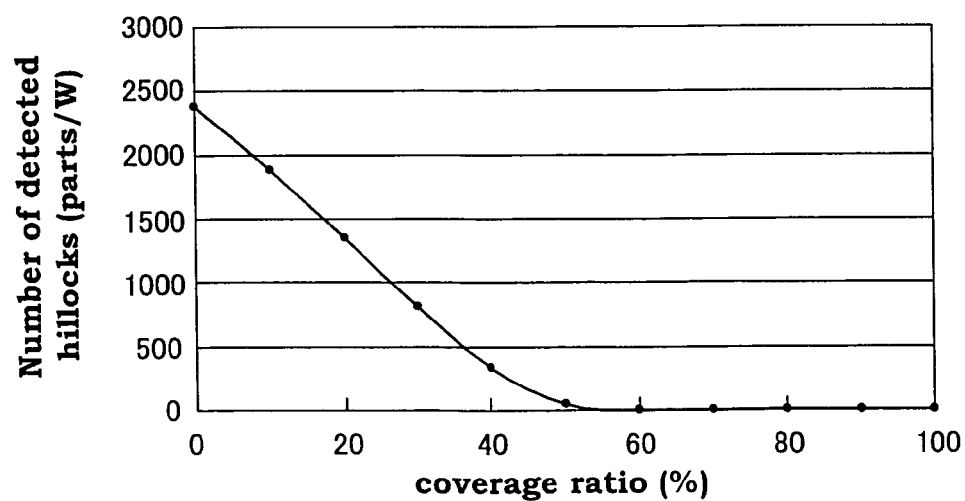
FIG. 21 is a graph showing a relationship between coverage ratio and the number of detected hillocks per workpiece (i.e. sample) according to an example of the invention.

The scope over which the influence of Rayleigh scattered light SC extends is affected by the following: the structure or the material of the first or second wiring layer 3 or 7, the first insulating layer 5, or the fine projections 9; the wavelength or the intensity of the inspecting light; or the like. The scope can be experimentally determined. An example of such an experiment is described herein. About such semiconductor devices as illustrated in FIGS. 20A and 20B (which were produced in the same way as for producing the semiconductor device illustrated in FIGS. 1A and 1B), wherein the ratio of the area of the first wirings 3a covered with second wirings 7a to the total area of the first wirings 3a (coverage ratio) was changed from 0 to 100% at intervals of 10% (that is, the first wirings 3a was shifted in the direction shown by an arrow X in FIG. 20B), the number of detected hillocks which were present in the first wirings 3a was inspected. The widths of the first and seconds wirings 3a and 7a were each set to 0.3 μm. The used inspecting light was perpendicularly-falling light having a wavelength of 380 nm. The appearance inspection for the semiconductor devices was made by pattern-comparison. The results are shown in FIG. 21. According to FIG. 21, as the coverage ratio is larger, the number of the detected hillocks is smaller. When the coverage ratio is 40%, the number is about 1/10 of the number when the coverage ratio is 0%. When the coverage ratio is 50%, the number of the detected hillocks is approximately zero. When the coverage ratio is 50%, each of the first wirings 3a is uncovered by 0.15 μm. In this uncovered sites, no hillocks are detected. This appears to be because reflected light from the first wiring layer 3 is not recognized by an influence of Rayleigh scattered light. It can be understood from this result that an influence of reflected light from the first wiring layer 3 can be restrained in the range having a width of about 0.15 μm by Rayleigh scattered light generated by the fine projections 9.

3-2. Classification of a Detected Object

As described above, the formation of fine projections makes it possible to restrain an influence of reflected light from the first wiring layer 3. However, the fine projections are inspected together with defects in the second wirings 7a in the step of inspecting the appearance of the second wiring layer 7; therefore, the precision of the appearance inspection may be rather lowered unless an object detected in the step of inspecting the appearance of the second wiring layer 7 can be classified into either the fine projection or a defect. This classification is performed for each of detected objects.

Thus, the method for inspecting an appearance of an embodiment of the invention preferably further comprises the step of classifying the object into either the fine projection or a defect. The classification can be performed by the following various methods:

(1) Classification Based on the Size of a Detected Object

This classification method makes use of the fact that the size of the fine projections is already known. For example, if the size of a detected object is within a predetermined range or not less than a predetermined reference value (for example, the plane diameter is 40 nm or less), it is determined that the detected object is the fine projection. If not so, it is determined that the detected object is a defect.

(2) Classification Based on the Intensity of Reflected Light from a Detected Object This classification method makes use of the fact that the intensity of reflected light from the fine projections is already known. For example, if the intensity of reflected light from a detected object is within a predetermined range, it is determined that the detected object is the fine projection. If not so, it is determined that the detected object is a defect.

(3) Classification Based on the Wavelength of Reflected Light from a Detected Object This classification method makes use of the fact that the intensity of reflected light from the fine projections is already known at plural wavelengths. An appearance inspection is made by use of inspecting light composed of light having plural wavelengths different from each other. Alternatively, while the wavelength-of inspecting light is varied, inspection is made plural times, whereby the intensities of reflected light reflected from a detected object is obtained at the plural wavelengths, respectively. As a result, if the intensities of the reflected light from the detected object at all of the wavelengths of the inspecting light are each within a predetermined range set for each of the wavelengths, it is determined that the detected object is the fine projection. If not so, it is determined that the detected object is a defect.

(4) Classification Based on the Shape of a Detected Object

This classification method makes use of the fact that the shape of the fine projections is already known. The shape of the fine projections is, for example, a circular shape or a semicircular shape. Accordingly, if the detected object has such a shape, it is determined that the detected object is the fine projection. If not so, it is determined that the detected object is a defect.

(5) Classification Based on the Number Density of Detected Objects

This classification method makes use of the fact that the number density of the fine projections is already known. If the number density of the detected objects is within a predetermined range, it is determined that the detected objects are the fine projections. If not so, it is determined that the detected objects are defects.

(6) Classification Based on the Element(s) or the Composition of a Detected Object This classification method makes use of the fact that the element(s) or the composition of the fine projections is already known. For example, considered is the case that the fine projections are made of silicon nitride. In this case, if detected object is made of silicon nitride, it is determined that the detected object is the fine projection. If not so, it is determined that the detected object is a defect.

The element(s) or the composition of the detected object can be analyzed with an electron probe micro-analyzer (EPMA) or the like.

(7) Classification Based on the Density of a Detected Object

This classification makes use of the fact that the density (mass per unit volume) of the fine projections is already known. If the density of a detected object is within a predetermined range, it is determined that the detected object is the fine projection. If not so, it is determined that the detected object is a defect.

The density of the detected object can be measured by the X-ray interference method, wherein the total reflection critical angle of X-rays is measured to measure the density of a film, or some other method.

4. Appearance Inspecting Device

The above-mentioned method for appearance inspection can be suitably carried out by use of an apparatus for appearance inspection described just below.

Figure 22:
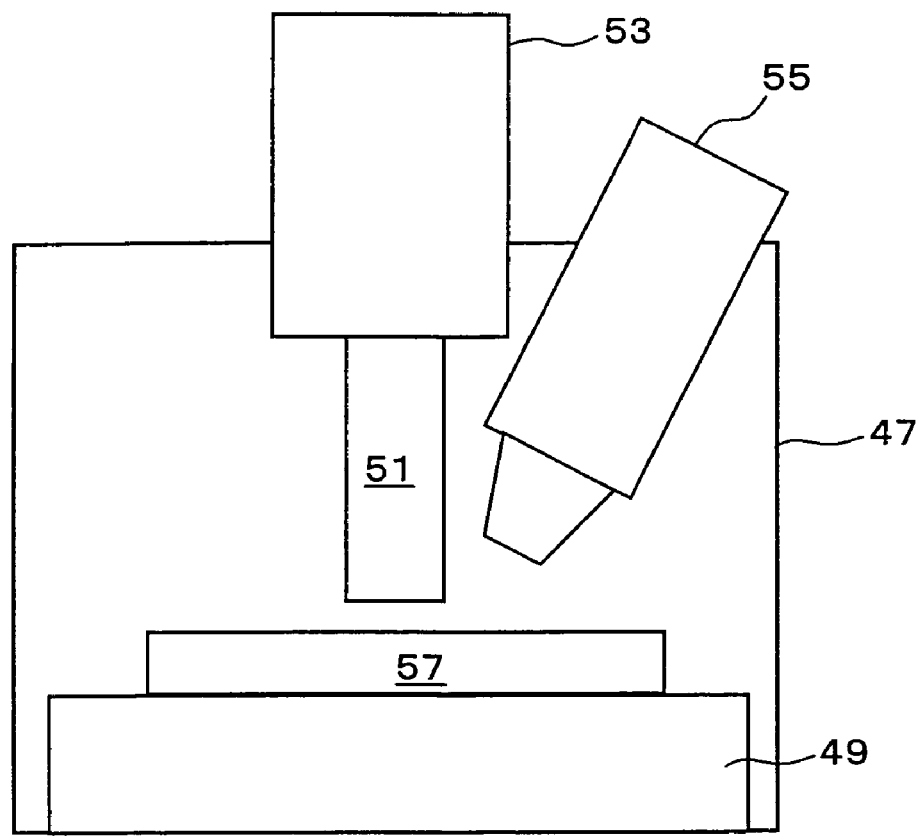
FIG. 22 is a schematic view illustrating an apparatus for inspecting an appearance of a semiconductor device, of an embodiment of the invention.

As illustrated in FIG. 22, an example of the apparatus for appearance inspection of an embodiment of the invention has a pressure-reducing chamber 47, a sample holder 49 for holding a sample in the pressure-reducing chamber 47, a light source 53 for radiating inspecting light through a microscopic section 51 onto the sample held on the sample holder 49, and an analyzing unit 55 for receiving light reflected on the sample and analyzing the light. In FIG. 22, a semiconductor device 57 is put as the sample onto the sample holder 49.

In this device, the semiconductor device 57 is held in the pressure-reducing chamber 47; thus, the appearance inspection thereof can be made under a reduced pressure. When the inspection is made under a reduced-pressure, Rayleigh scattering based on molecules in the atmosphere can be decreased.

The analyzing unit 55 has an image pickup element. The analyzing unit 55 has a structure capable of performing classification of a detected object into the fine projection or a defect on the basis of the above-mentioned various standards. In this case, the classification can easily be performed. In the case that much time is required for operation for the classification, it is desired that a structure capable of performing the classification automatically is employed. Further, a structure enabling observation or inspection with an SEM or the like may be employed.

Others

Two or more out of the various characteristics described about the above-mentioned embodiments may be combined with each other. When one out of the embodiments has plural characteristics, one or more out of the characteristics may be appropriately extracted and then the extracted single characteristic or a combination of the extracted characteristics may be adopted in the invention.

What is claimed is:

1. A method for inspecting an appearance of a semiconductor device comprising the steps of:
    radiating inspecting light with a wavelength of 4 to 400 nm to the semiconductor device, including a first wiring layer having a first wiring, a second wiring layer having a second wiring formed over the first wiring layer, and a first insulating layer interposed between the first and second wiring layers, wherein the second wiring layer or an upper layer thereof has a fine projection, and the diameter of a circle circumscribing the projection in a plane or sectional view is 40 nm or less, to cause Rayleigh scattering on the fine projection while causing the inspecting light to be reflected on the surface of the second wiring layer;
    receiving light reflected on the surface of the second wiring layer by means of an image pickup element; and
    making an appearance inspection of the second wiring layer on the basis of data obtained from the received light.

2. The method of claim 1, wherein the inspecting light is composed of light having a substantially single wavelength.

3. The method of claim 1, wherein the inspecting light is composed of synthetic light composed of light having plural wavelengths different from each other.

4. The method of claim 1, wherein the inspecting light is radiated substantially perpendicularly to the surface of the second wiring layer.

5. The method of claim 1, wherein the inspecting light is radiated obliquely to the surface of the second wiring layer.

6. The method of claim 1, wherein the appearance inspection of the second wiring layer is performed by pattern-comparison.

7. The method of claim 1, wherein the image pickup element is disposed to oppose a light receiving face thereof to the surface of the second wiring layer.

8. The method of claim 1, wherein the image pickup element is disposed to make a light receiving face thereof oblique to the surface of the second wiring layer.

9. The method of claim 1, wherein the appearance inspection is made under the atmospheric pressure.

10. An apparatus for inspecting an appearance of a semiconductor device operable to implement the method of claim 1, wherein the appearance inspection can be made under a reduced pressure.

11. The method of claim 1, wherein the appearance inspection is made under a reduced pressure.

12. The method of claim 1, wherein the appearance inspection is made in an atmosphere having a refractive index different from that of the fine projection.

13. The method of claim 1, further comprising the step of classifying an object detected in the appearance inspection, into either the fine projection or a defect.

14. The method of claim 13, wherein the classification is performed based on the size of the detected object.

15. The method of claim 13, wherein the classification is performed based on the intensity of reflected light from the detected object.

16. The method of claim 13, wherein the classification is performed based on the wavelength of reflected light from the detected object.

17. The method of claim 13, wherein the classification is performed based on the shape of the detected object.

18. The method of claim 13, wherein the classification is performed -based on the element of the detected object.

19. The method of claim 13, wherein the classification is performed based on the composition of the detected object.

20. The method of claim 13, wherein the classification is performed based on the number density or density of the detected object.

21. An apparatus for inspecting an appearance of a semiconductor device operable to implement the method of claim 13, comprising an analyzer enabling the classification of the detected object into either the fine projection or a defect.

* * * * *